(12) United States Patent
Lee

(10) Patent No.: US 11,989,481 B2
(45) Date of Patent: May 21, 2024

(54) DISPLAY DEVICE, METHOD OF MANUFACTURING THE SAME AND TILED DISPLAY DEVICE INCLUDING THE SAME

(71) Applicant: Samsung Display Co., LTD., Yongin-si (KR)

(72) Inventor: Dong Sung Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/182,278

(22) Filed: Mar. 10, 2023

(65) Prior Publication Data
US 2023/0315376 A1    Oct. 5, 2023

(30) Foreign Application Priority Data
Mar. 29, 2022   (KR) .......................... 10-2022-0039059

(51) Int. Cl.
   *G06F 3/14*      (2006.01)
   *H10K 77/10*     (2023.01)
(52) U.S. Cl.
   CPC .......... *G06F 3/1446* (2013.01); *H10K 77/111* (2023.02)
(58) Field of Classification Search
   CPC ............................ G06F 3/1446; H10K 77/111
   See application file for complete search history.

(56) References Cited

U.S. PATENT DOCUMENTS

| | | | | |
|---|---|---|---|---|
| 2006/0066788 A1* | 3/2006 | Utsumi | ............. | G02F 1/133509 349/120 |
| 2009/0194770 A1* | 8/2009 | Liu | .................... | H01L 21/02595 257/E33.003 |
| 2009/0246939 A1* | 10/2009 | Azuma | ............. | H01L 21/02686 257/E21.318 |
| 2011/0253987 A1* | 10/2011 | Chung | ................ | H01L 27/1277 257/66 |
| 2016/0005804 A1* | 1/2016 | Oh | ........................ | H10K 10/486 438/239 |
| 2016/0351539 A1* | 12/2016 | Bower | ................... | H01L 25/167 |
| 2017/0102797 A1* | 4/2017 | Cok | ...................... | G06F 3/0412 |
| 2017/0323910 A1* | 11/2017 | Park | ................... | H10K 59/1213 |
| 2020/0211929 A1* | 7/2020 | Son | ..................... | G02F 1/13336 |
| 2022/0093883 A1* | 3/2022 | Jian | ....................... | H10K 30/353 |

FOREIGN PATENT DOCUMENTS

JP           2017-161887 A          9/2017

* cited by examiner

*Primary Examiner* — Ryan A Lubit
(74) *Attorney, Agent, or Firm* — Lewis Roca Rothgerber Christie LLP

(57) ABSTRACT

A display device, a method of manufacturing the same and a tiled display device including the same are provided. The display device includes a substrate including a first contact hole, a laser absorption layer on the substrate and containing amorphous silicon, a first barrier insulating layer on the laser absorption layer, a fan-out line on the first barrier insulating layer as a first metal layer and including a pad portion in a second contact hole located in the first barrier insulating layer and the laser absorption layer, a display layer on the fan-out line, and a flexible film under the substrate and in the first contact hole and electrically connected to the pad portion.

20 Claims, 20 Drawing Sheets

SP: SP1, SP2, SP3

DPL: TFTL, EML, WLCL, CFL
TFT: SE, GE, ACT, DE
MTL1: FOL
MTL2: CWL, VL1, VL2
ACTL: ACT, DE, SE
MTL3: GE
MTL4: CNE1, CNE2

DPL: TFTL, EML, WLCL, CFL
TFT: SE, GE, ACT, DE
MTL1: FOL
MTL2: CWL, VL1, VL2
ACTL: ACT, DE, SE
MTL3: GE
MTL4: CNE1, CNE2

DPL: TFTL, EML, WLCL, CFL
TFT: SE, GE, ACT, DE
MTL1: FOL
MTL2: CWL, VL1, VL2
ACTL: ACT, DE, SE
MTL3: GE
MTL4: CNE1, CNE2

DISPLAY DEVICE, METHOD OF MANUFACTURING THE SAME AND TILED DISPLAY DEVICE INCLUDING THE SAME

CROSS-REFERENCE TO RELATED APPLICATION

This application claims priority to and the benefit of Korean Patent Application No. 10-2022-0039059 filed on Mar. 29, 2022, in the Korean Intellectual Property Office, the content of which is incorporated by reference herein.

BACKGROUND

1. Field

The present disclosure relates to a display device, a method of manufacturing the same and a tiled display device including the same.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions. The display device may be a flat panel display device such as a liquid crystal display device, a field emission display device, and an organic light emitting display device. Among the flat panel display devices, in the light emitting display device, because each of the pixels of a display panel includes a light emitting element capable of emitting light by itself, an image can be displayed without a backlight unit providing light to the display panel.

When the display device is manufactured in a large size, a defect rate of the light emitting element may increase due to an increase in the number of pixels, thereby deteriorating productivity or reliability of the display device. To solve this problem, in a tiled display device, a large-sized screen may be implemented by connecting a plurality of display devices having a relatively small size. The tiled display device may include a boundary portion called a seam between the plurality of display devices, due to a non-display area or a bezel area of each of the plurality of display devices adjacent to each other. When a single image is displayed on the entire screen, the boundary portion between the plurality of display devices gives a sense of disconnection over the entire screen, thereby reducing a sense of immersion in the image.

SUMMARY

Aspects and features of embodiments of the present disclosure provide a display device capable of preventing damage to a second substrate or a display layer in an etching process of a first substrate, a method of manufacturing the same, and a tiled display device including the same.

Aspects and features of embodiments of the present disclosure also provide a display device capable of removing a sense of disconnection between a plurality of display devices and improving a sense of immersion in an image by preventing a boundary portion or a non-display area between the plurality of display devices from being recognized, a method of manufacturing the same, and a tiled display device including the same.

However, aspects and features of embodiments of the present disclosure are not restricted to those set forth herein. The above and other aspects of the present disclosure will become more apparent to one of ordinary skill in the art to which the present disclosure pertains by referencing the detailed description of the present disclosure given below.

According to one or more embodiments of the present disclosure, a display device includes a substrate including a first contact hole, a laser absorption layer on the substrate and including amorphous silicon, a first barrier insulating layer on the laser absorption layer, a fan-out line on the first barrier insulating layer as a first metal layer and including a pad portion in a second contact hole located in the first barrier insulating layer and the laser absorption layer, a display layer on the fan-out line, and a flexible film under the substrate and in the first contact hole and electrically connected to the pad portion.

In one or more embodiments, the laser absorption layer has a thickness of 300 angstroms (Å) to 1000 Å.

In one or more embodiments, the laser absorption layer has a transmittance of 10% or less for light having a wavelength of 300 nm to 400 nm.

In one or more embodiments, a thickness of the laser absorption layer is smaller than a thickness of the first barrier insulating layer.

In one or more embodiments, a thickness of the laser absorption layer is smaller than a thickness of the fan-out line.

In one or more embodiments, the display layer includes a connection portion on the first metal layer as a second metal layer and connected to the fan-out line, a data line extending in a first direction as the second metal layer, and high potential lines on the second metal layer and extending in the first direction.

In one or more embodiments, the pad portion is configured to supply a data voltage to the plurality of data lines through the connection portion, and the pad portion is configured to supply a high potential voltage to the plurality of high potential lines through the connection portion.

In one or more embodiments, the display layer includes a thin film transistor including an active layer on the second metal layer and a third metal layer, and a connection electrode on the third metal layer as a fourth metal layer, wherein one end of the connection electrode is connected to the high potential line, and the other end of the connection electrode is connected to the thin film transistor.

In one or more embodiments, the display layer further includes a light emitting element layer on the fourth metal layer, and wherein the light emitting element layer includes a first electrode connected to the connection electrode, a second electrode at a same layer as the first electrode, and a light emitting element aligned between the first electrode and the second electrode and electrically connected between the first electrode and the second electrode.

In one or more embodiments, the display device further includes a display driver mounted on the flexible film to supply a data voltage, a power voltage, or a gate signal.

According to one or more embodiments of the present disclosure, a method of manufacturing a display device, includes providing a first substrate, forming a laser absorption layer containing amorphous silicon on the first substrate, forming a first barrier insulating layer on the laser absorption layer, forming a first contact hole through the first barrier insulating layer and the laser absorption layer, forming a fan-out line on the first barrier insulating layer and including a pad portion in the first contact hole, forming a display layer on the fan-out line, exposing the pad portion and a portion of the laser absorption layer by etching the first substrate to form a second contact hole, and inserting a flexible film into the second contact hole to electrically connect the flexible film to the pad portion.

In one or more embodiments, the exposing of the pad portion and a portion of the laser absorption layer includes irradiating a laser having a wavelength of 300 nm to 400 nm to the first substrate.

In one or more embodiments, the method further includes forming a second substrate on the fan-out line.

In one or more embodiments, in the exposing of the pad portion and a portion of the laser absorption layer, the laser absorption layer and the pad portion absorb the laser.

In one or more embodiments, the forming of the first contact hole includes exposing a portion of the first substrate by etching the first barrier insulating layer and the laser absorption layer.

In one or more embodiments, the laser absorption layer has a thickness of 300 Å to 1000 Å.

In one or more embodiments, the laser absorption layer has a transmittance of 10% or less for light having a wavelength of 300 nm to 400 nm.

In one or more embodiments, a thickness of the laser absorption layer is smaller than a thickness of the first barrier insulating layer.

In one or more embodiments, a thickness of the laser absorption layer is smaller than a thickness of the fan-out line.

According to one or more embodiments of the present disclosure, a tiled display device includes a plurality of display devices including a display area including a plurality of pixels and a non-display area surrounding the display area, and a bonding member configured to bond the plurality of display devices, wherein at least one of the plurality of display devices includes a substrate including a first contact hole, a laser absorption layer on the substrate and including amorphous silicon, a first barrier insulating layer on the laser absorption layer, a fan-out line on the first barrier insulating layer as a first metal layer and including a pad portion in a second contact hole located in the first barrier insulating layer and the laser absorption layer, a display layer on the fan-out line, and a flexible film under the substrate and in the first contact hole and electrically connected to the pad portion.

In the display device, the method of manufacturing the same, and the tiled display device including the same according to one or more embodiments, damage to the second substrate or the display layer may be prevented by including a laser absorption layer that absorbs a laser in the etching process of the first substrate.

In the display device, the method of manufacturing the same, and the tiled display device including the same according to one or more embodiments, the area of the non-display area of the display device may be reduced or minimized by electrically connecting a display driver disposed under a substrate to a connection portion on the substrate. Accordingly, the display device, the method of manufacturing the same, and the tiled display device including the same may prevent a user from recognizing the non-display area or the boundary portion between the plurality of display devices by reducing or minimizing a gap between the plurality of display devices.

However, the effects and aspects of the present disclosure are not limited to the aforementioned effects and aspects, and various other effects are included in the present disclosure.

BRIEF DESCRIPTION OF THE DRAWINGS

The present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Figure 1:
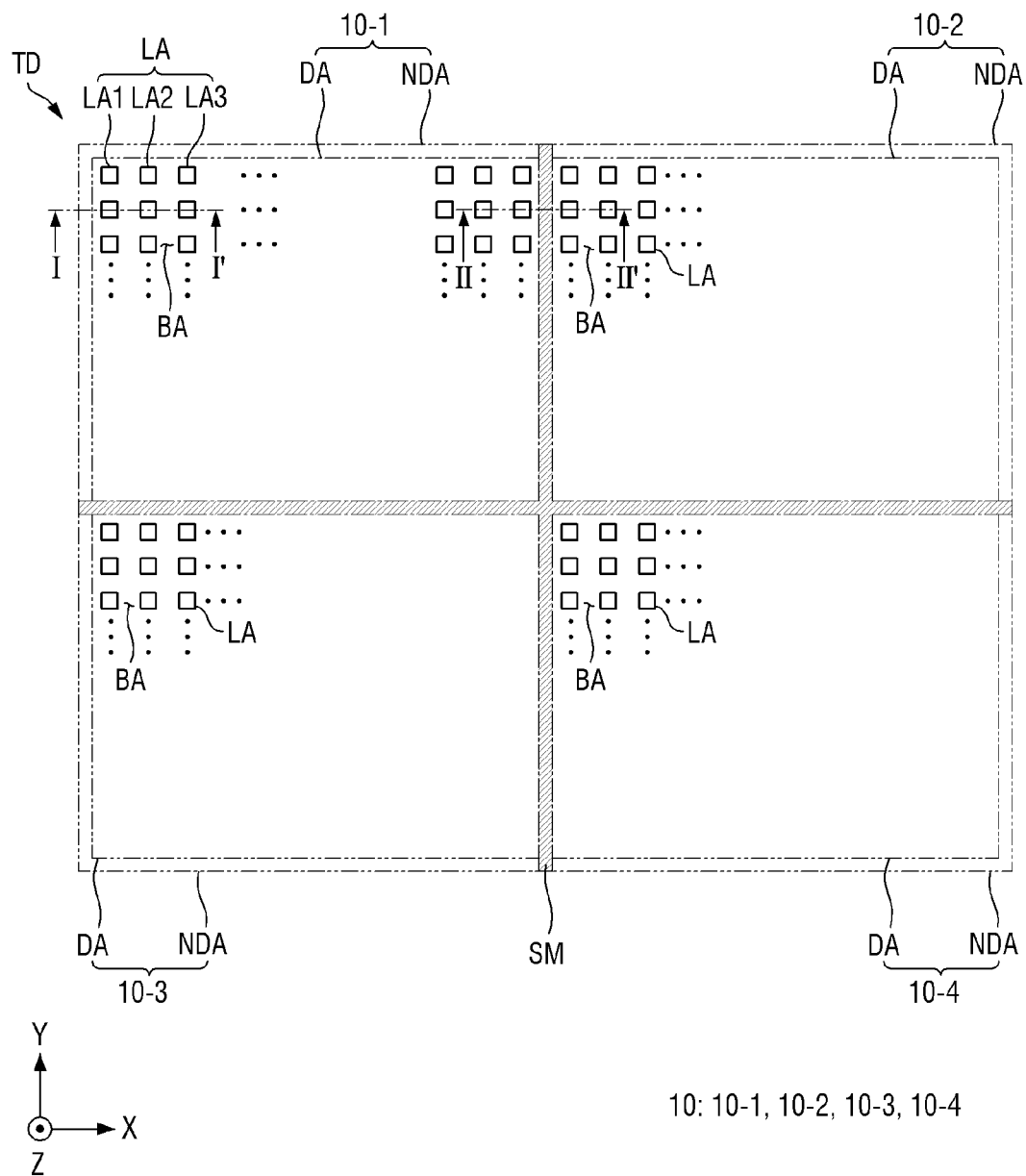
Figure 2:
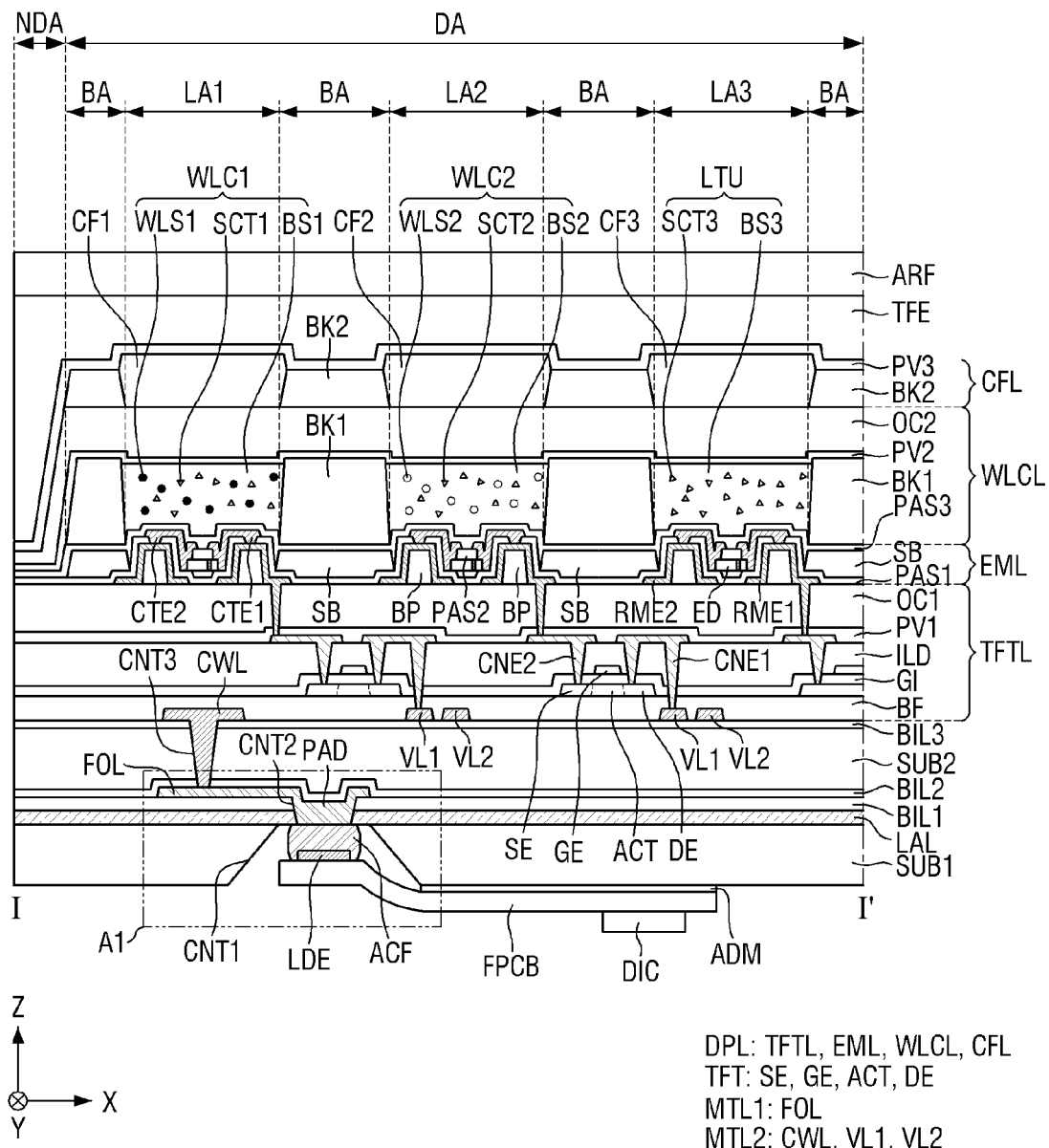
Figure 3:
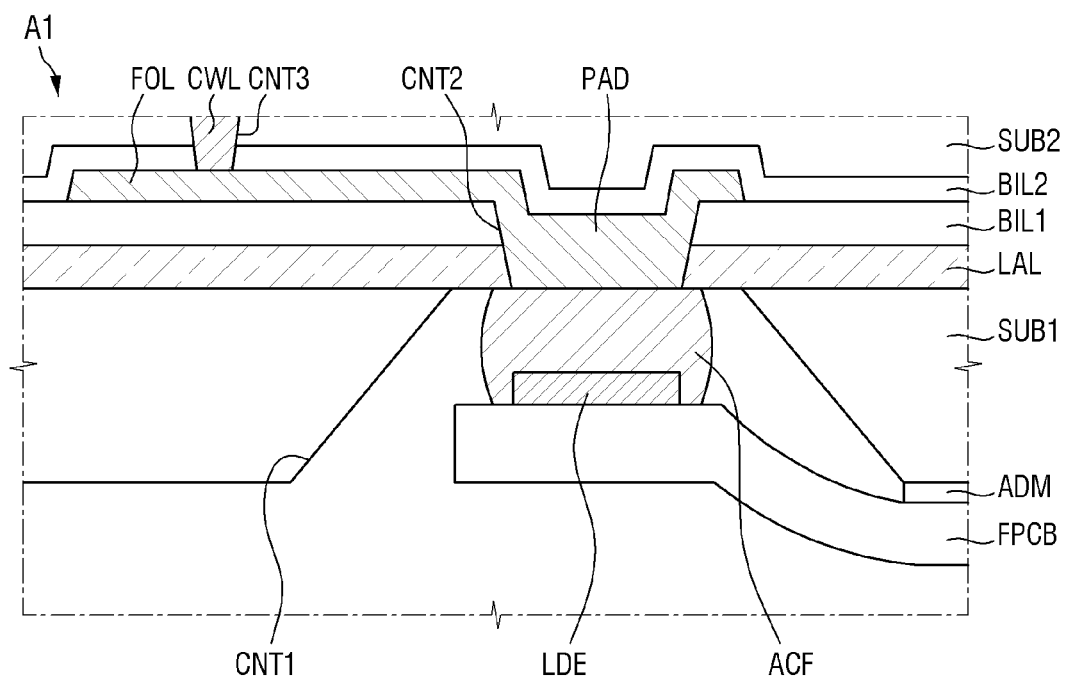
Figure 4:
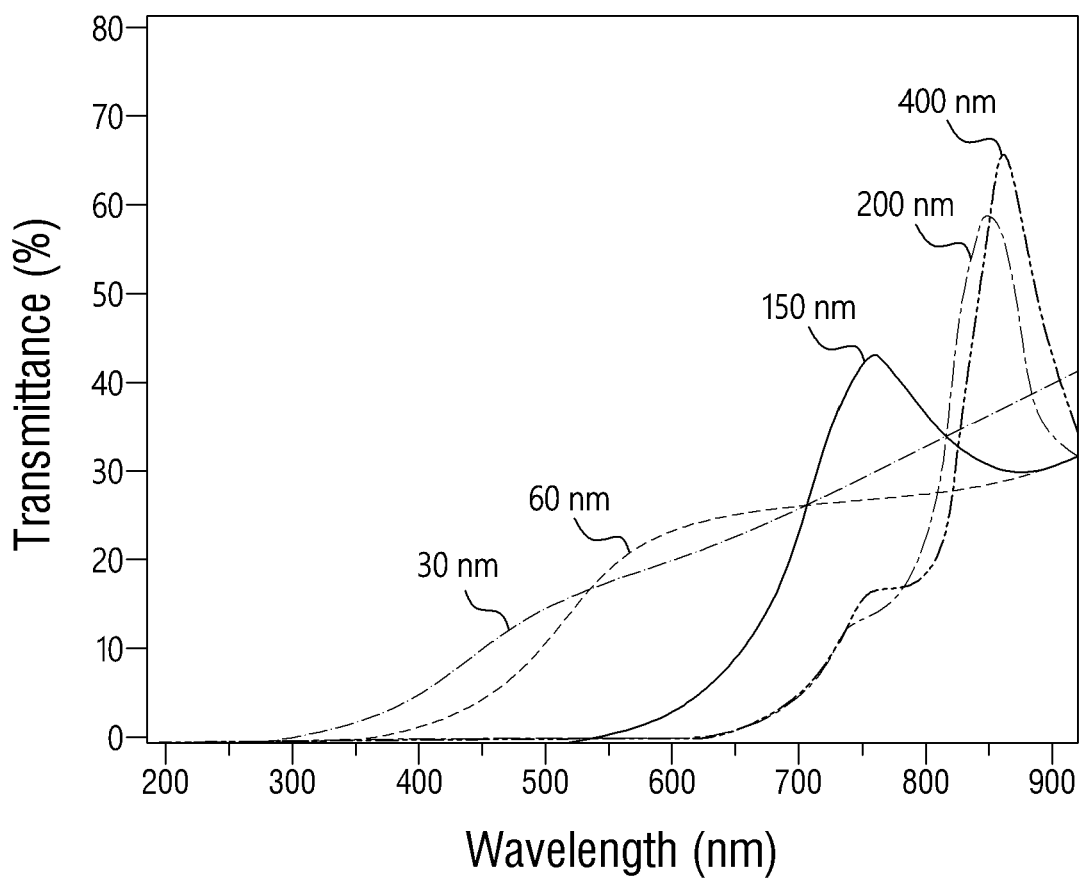
Figure 5:
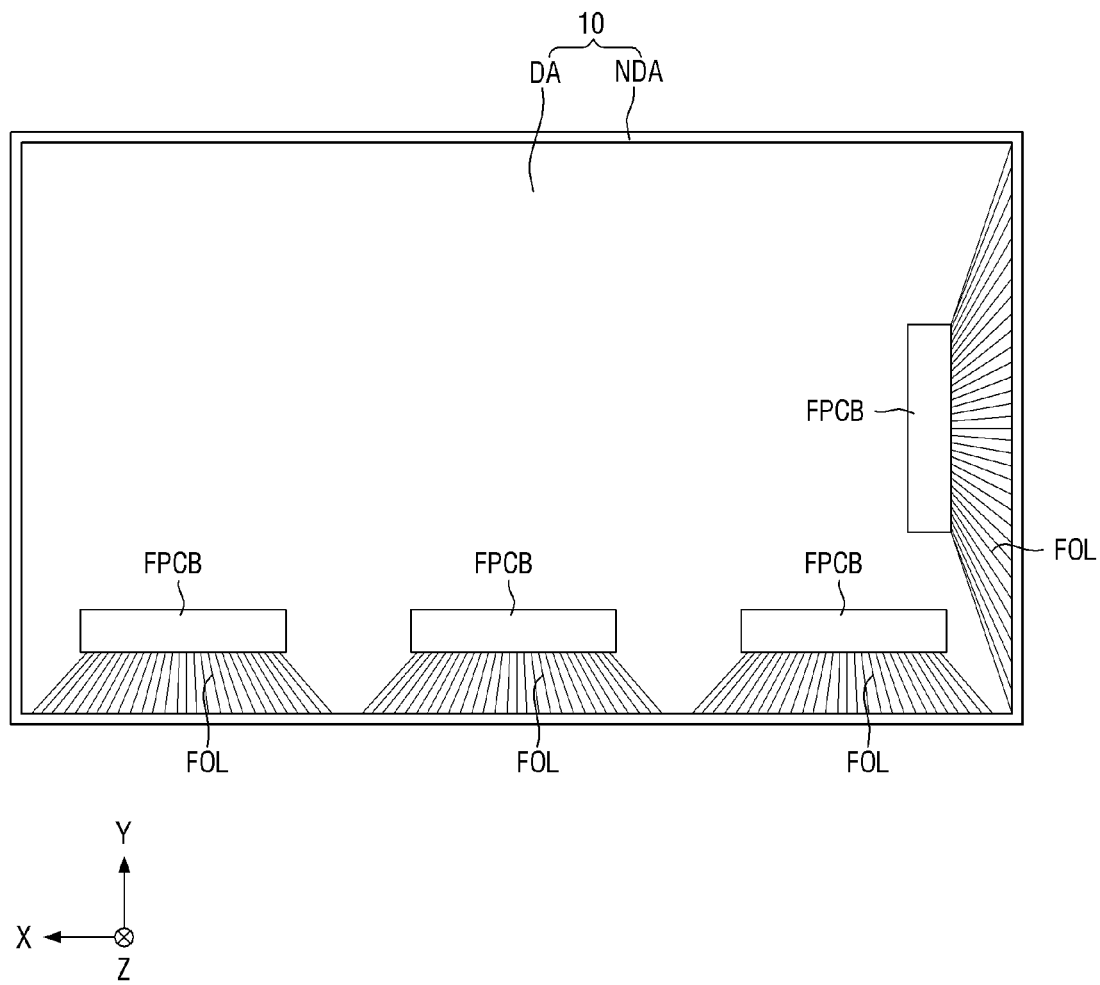
Figure 6:
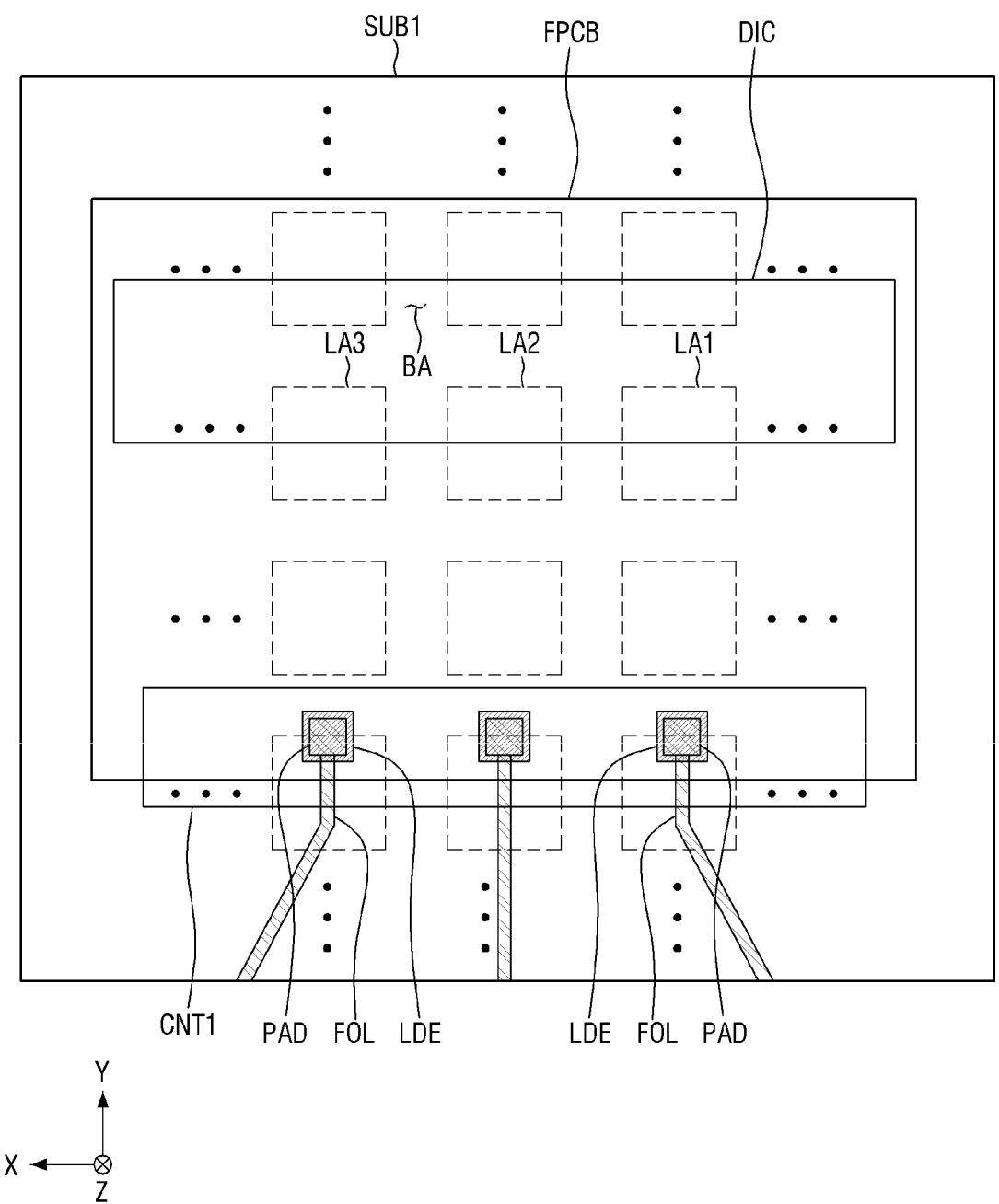
Figure 7:
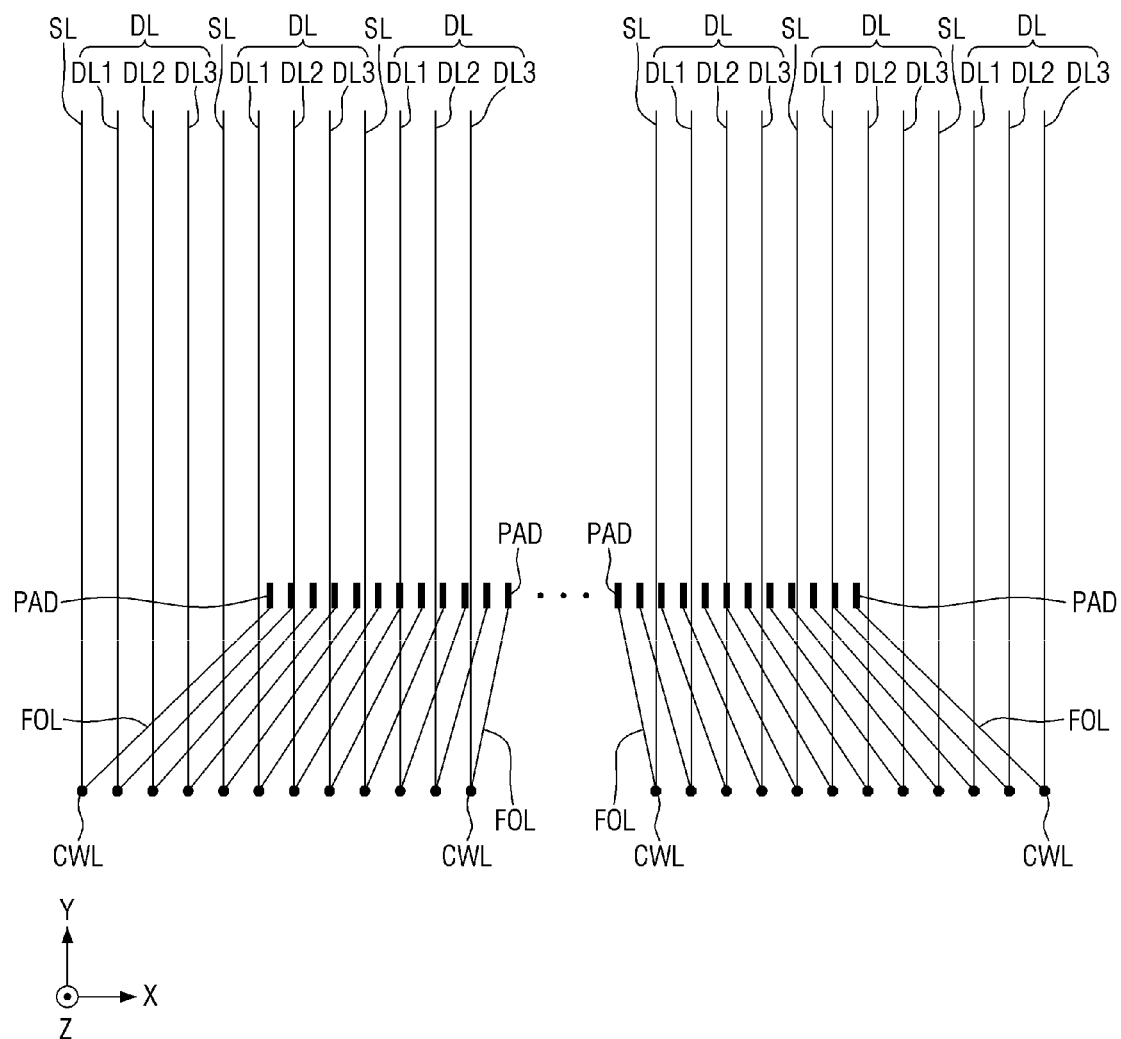
Figure 8:
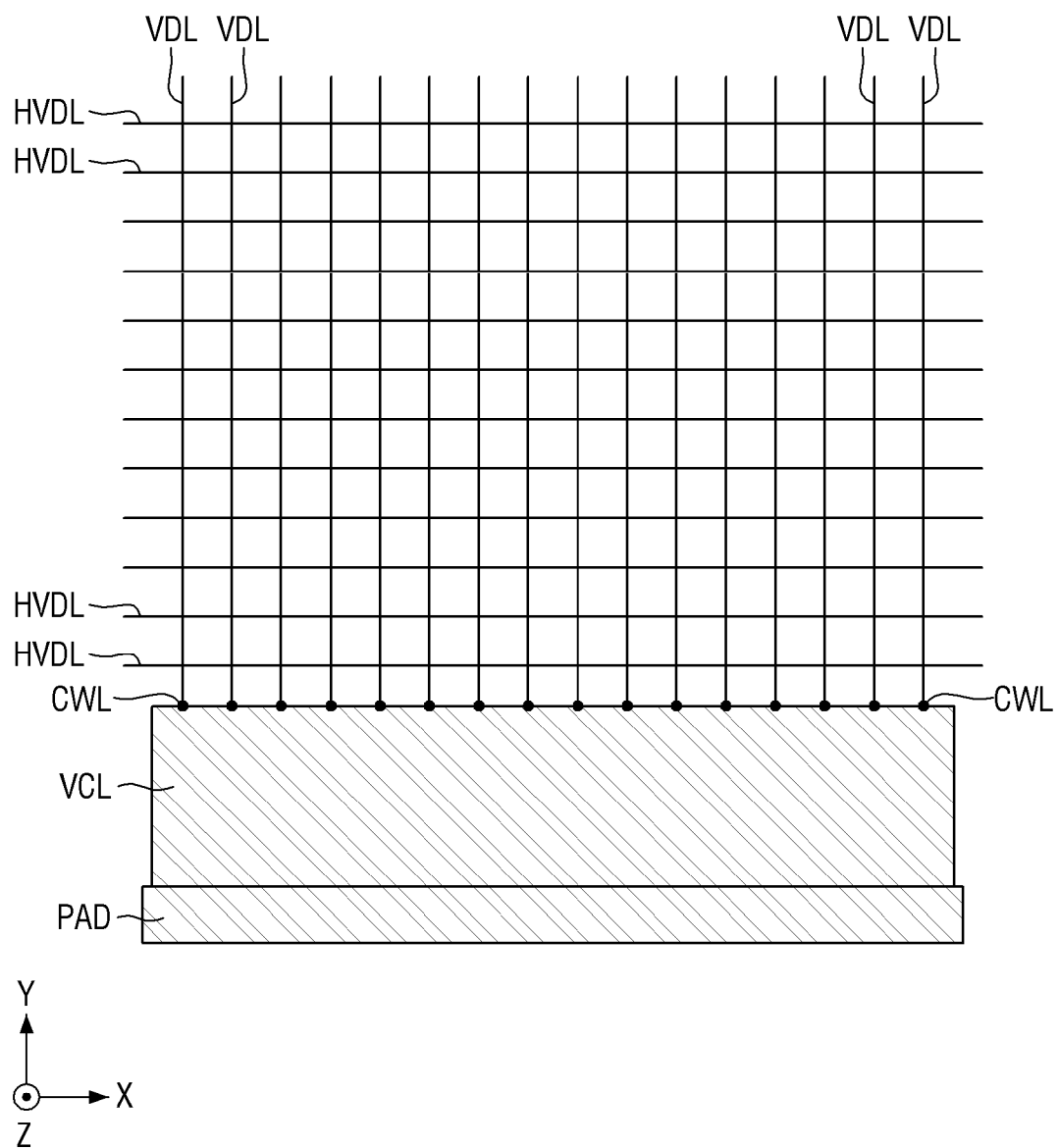
Figure 9:
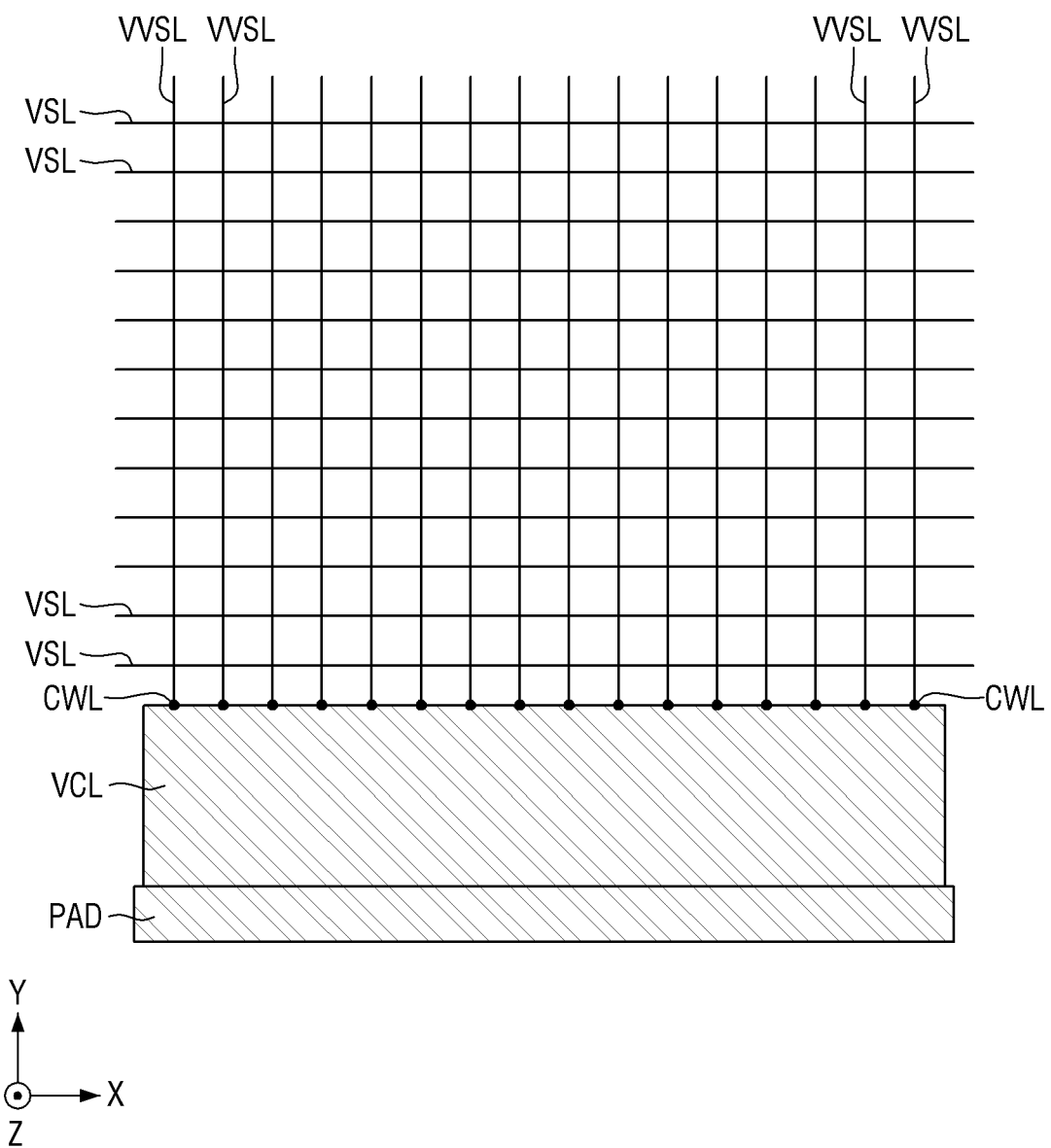
Figure 10:
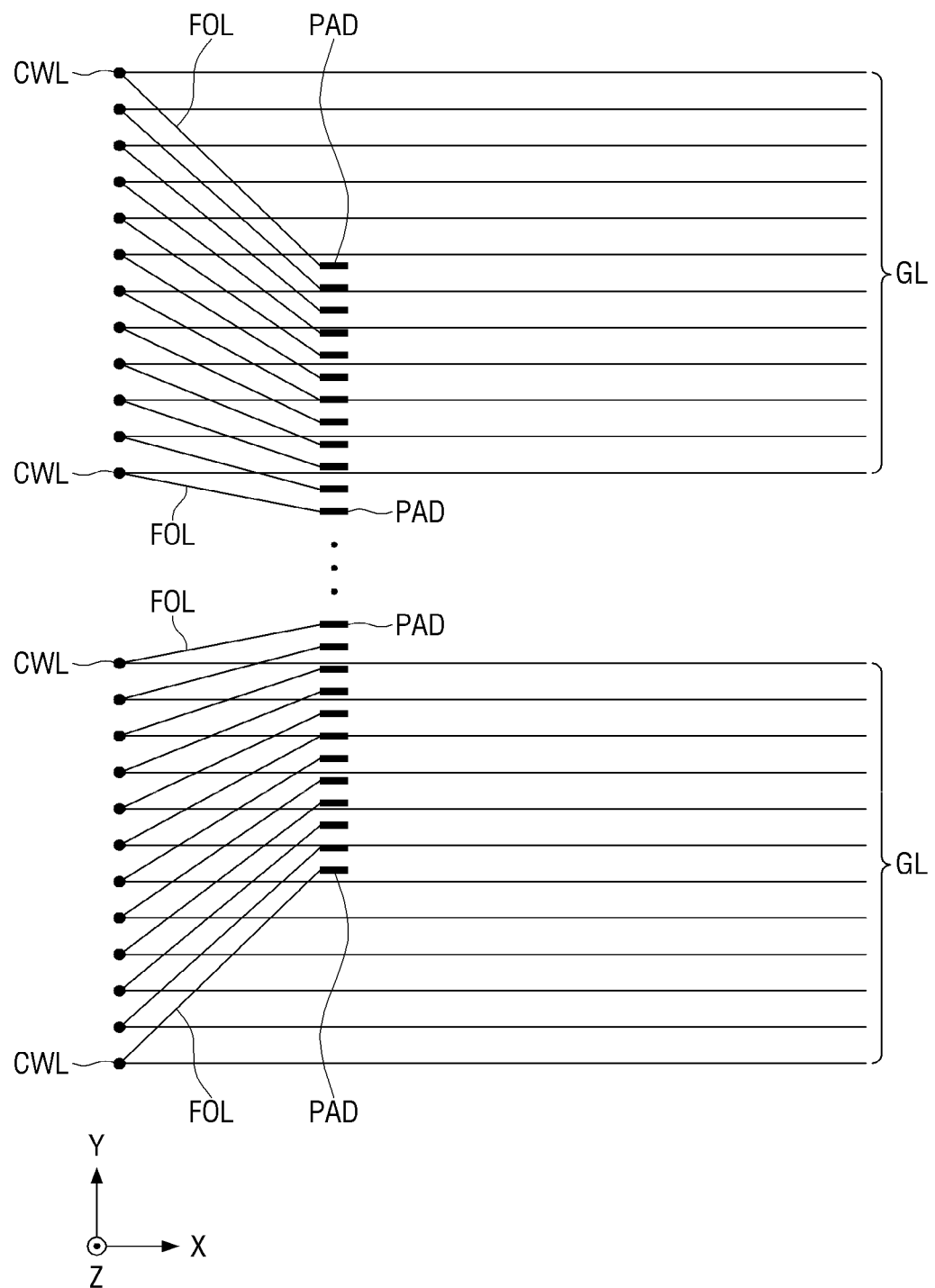
Figure 11:
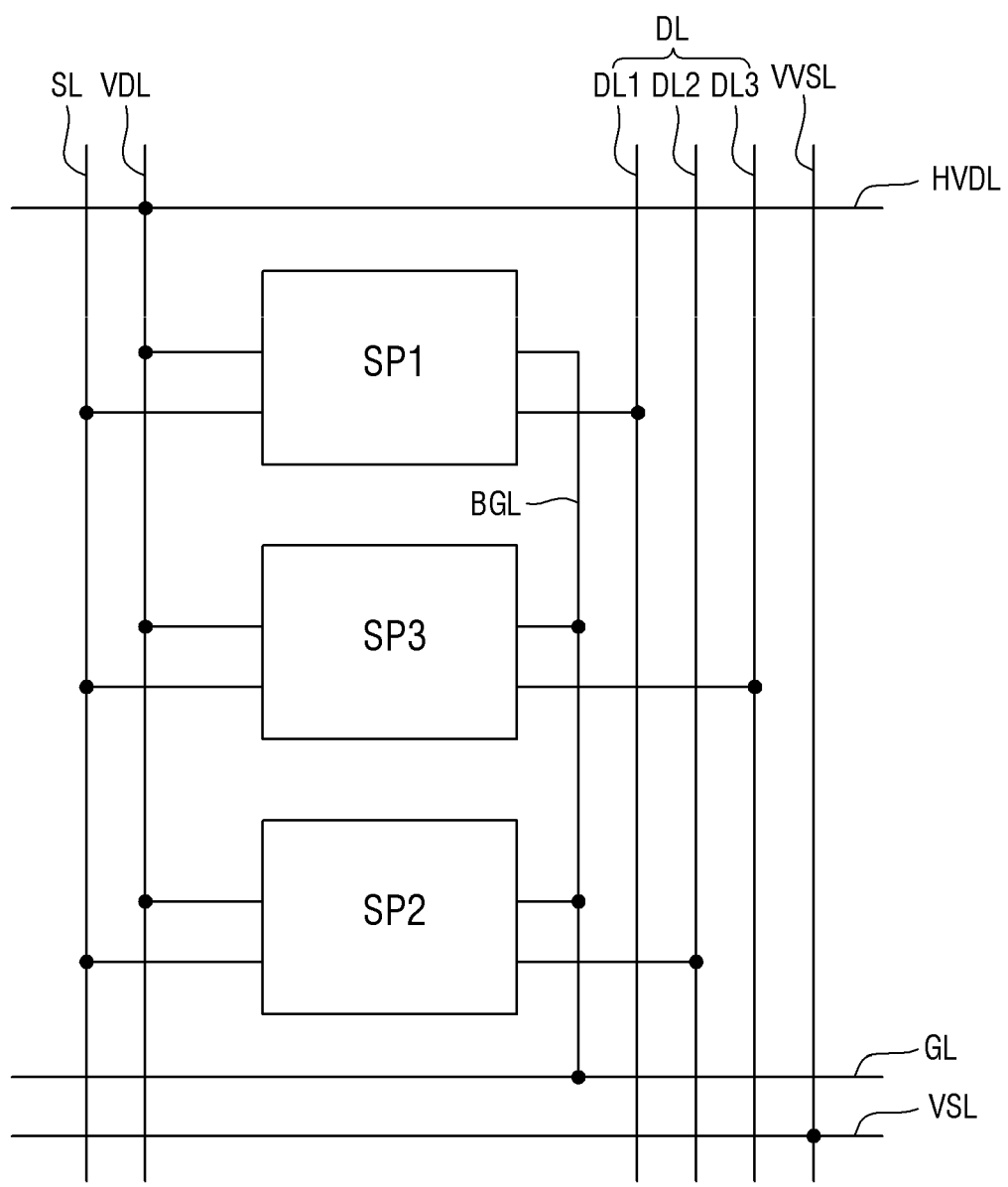
Figure 12:
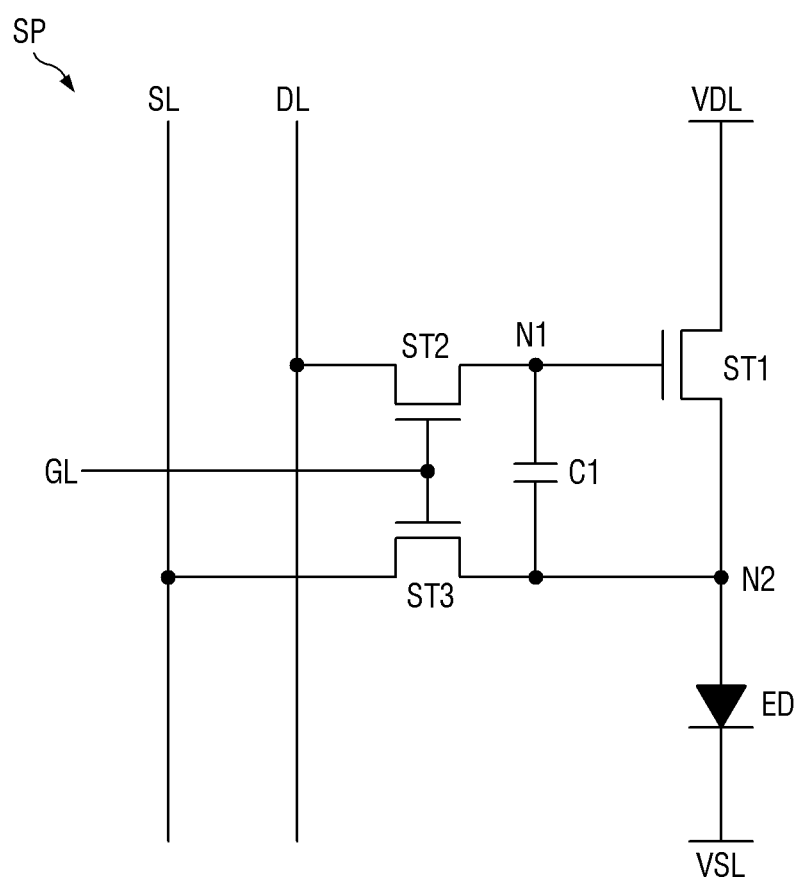
Figure 13:
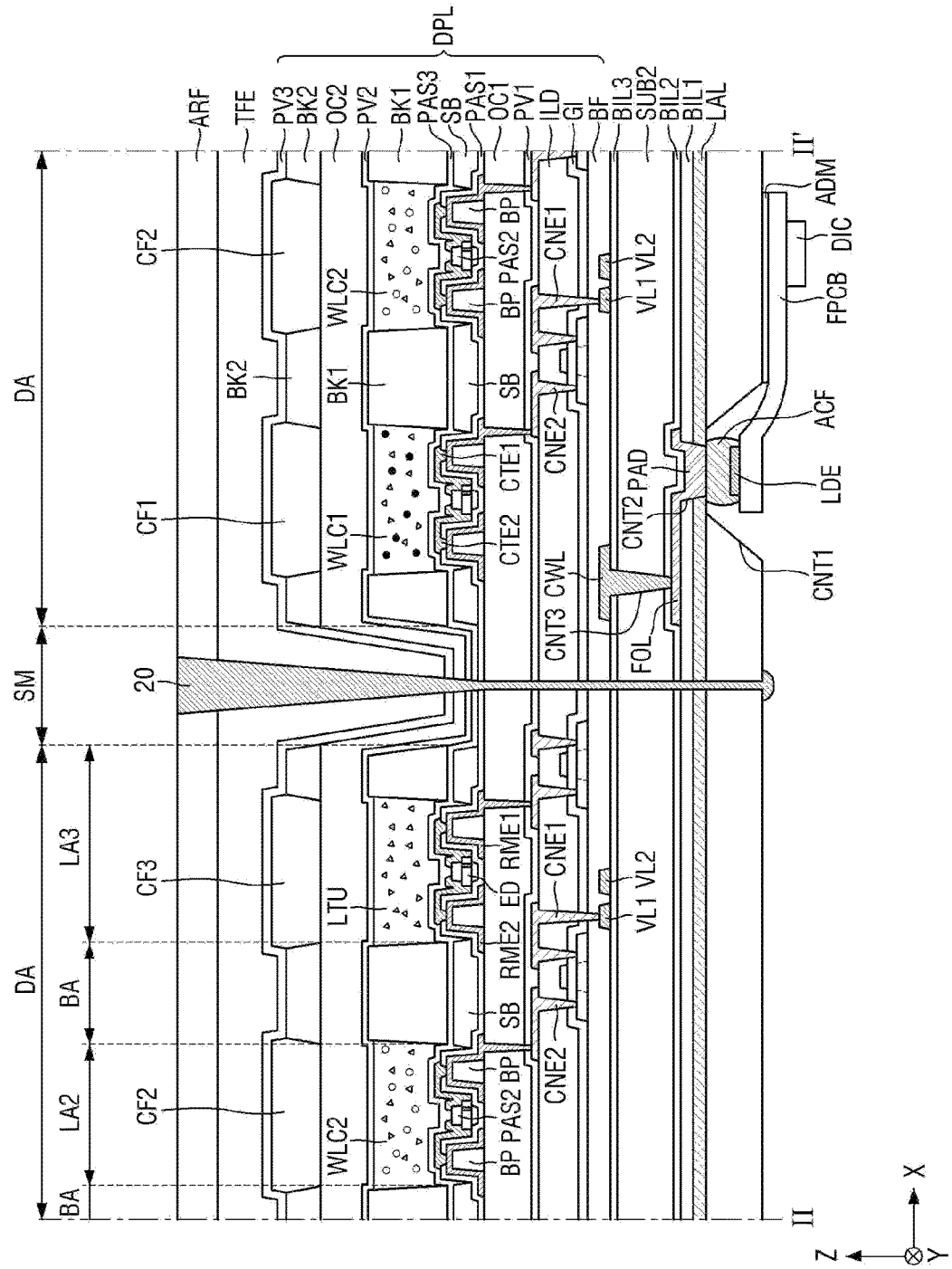

The above and other aspects and features of the present disclosure will become more apparent by describing in detail embodiments thereof with reference to the attached drawings, in which:

FIG. 1 is a plan view illustrating a tiled display device according to one or more embodiments;

FIG. 2 is a cross-sectional view taken along the line I-I' of FIG. 1;

FIG. 3 is an enlarged view of an area A1 of FIG. 2;

FIG. 4 is a graph illustrating transmittance of a laser absorption layer depending on a wavelength of light in a display device according to one or more embodiments;

FIG. 5 is a bottom view illustrating a display device according to one or more embodiments;

FIG. 6 is an enlarged bottom view illustrating a portion of a display device according to one or more embodiments;

FIG. 7 is a diagram illustrating a pad portion, a fan-out line, a sensing line, and a data line in a display device according to one or more embodiments;

FIG. 8 is a diagram illustrating a pad portion, a power connection line, a high potential line, and a horizontal voltage line in a display device according to one or more embodiments;

FIG. 9 is a diagram illustrating a pad portion, a power connection line, a low potential line, and a vertical voltage line in a display device according to one or more embodiments;

FIG. 10 is a diagram illustrating a pad portion, a fan-out line, and a gate line in a display device according to one or more embodiments;

FIG. 11 is a block diagram illustrating pixels and lines in a display device according to one or more embodiments;

FIG. 12 is a circuit diagram illustrating the pixel of FIG. 11;

FIG. 13 is a cross-sectional view taken along the line II-II' of FIG. 1; and FIGS. 14 to 20 are cross-sectional views illustrating a process of fabricating a display device according to one or more embodiments.

DETAILED DESCRIPTION

The present disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, embodiments of the present disclosure will be described with reference to the attached drawings.

FIG. 1 is a plan view illustrating a tiled display device according to one or more embodiments.

Referring to FIG. 1, a tiled display device TD may include a plurality of display devices 10 (10-1, 10-2, 10-3, and 10-4). The plurality of display devices 10 (10-1, 10-2, 10-3, and 10-4) may be arranged in a grid form, but are not limited thereto. The plurality of display devices 10 (10-1, 10-2, 10-3, and 10-4) may be connected in the first direction (X-axis direction) or the second direction (Y-axis direction), and the tiled display device TD may have a particular shape. For example, the plurality of display devices 10 (10-1, 10-2, 10-3, and 10-4) may have the same size, but are not limited thereto. For another example, the plurality of display devices 10 (10-1, 10-2, 10-3, and 10-4) may have different sizes.

The tiled display device TD may include first to fourth display devices 10-1 to 10-4. The number and connection relationship of the display devices 10 (10-1, 10-2, 10-3, and 10-4) are not limited to the embodiment of FIG. 1. The number of the display devices 10 (10-1, 10-2, 10-3, and 10-4) may be determined according to the size of each of the display devices 10 (10-1, 10-2, 10-3, and 10-4) and the tiled display device TD.

Each of the plurality of display devices 10 (10-1, 10-2, 10-3, and 10-4) may have a rectangular shape including long sides and short sides. The plurality of display devices 10 (10-1, 10-2, 10-3, and 10-4) may be arranged such that the long sides or the short sides thereof are connected to each other. Some of the display devices 10 (10-1, 10-2, 10-3, and 10-4) may be disposed at the edge of the tiled display device TD to form one side of the tiled display device TD. Some others of the display devices 10 (10-1, 10-2, 10-3, and 10-4) may be disposed at corners of the tiled display device TD to form two adjacent sides of the tiled display device TD. Yet some others of the display devices 10 (10-1, 10-2, 10-3, and 10-4) may be disposed on the inner side of the tiled display device TD, and may be surrounded by other display devices 10.

Each of the plurality of display devices 10 may include a display area DA and a non-display area NDA. The display area DA may include a plurality of pixels to display an image. Each of the plurality of pixels may include an organic light emitting diode (LED) including an organic light emitting layer, a quantum dot LED including a quantum dot light emitting layer, a micro LED, or an inorganic LED including an inorganic semiconductor. In the following, the case where each of the plurality of pixels includes an inorganic light emitting diode will be mainly described, but the present disclosure is not limited thereto. The non-display area NDA may be disposed around the display area DA to surround the display area DA, and may not display an image.

The display device 10 (10-1, 10-2, 10-3, and 10-4) may include a plurality of pixels arranged along a plurality of rows and columns in the display area DA. Each of the plurality of pixels may include an emission area LA defined by a pixel defining layer or bank, and may emit light having a suitable peak wavelength (e.g., a predetermined peak wavelength) through the emission area LA. For example, the display area DA of the display device 10 may include first to third emission areas LA1, LA2, and LA3. Each of the first to third emission areas LA1, LA2, and LA3 may be an area in which light generated from a light emitting element of the display device 10 is emitted to the outside of the display device 10.

The first to third emission areas LA1, LA2, and LA3 may emit light having a suitable peak wavelength (e.g., a predetermined peak wavelength) to the outside of the display device 10. The first emission area LA1 may emit light of a first color, the second emission area LA2 may emit light of a second color, and the third emission area LA3 may emit light of a third color. For example, the first color light may be red light having a peak wavelength in the range from about 610 nm to 650 nm, the second color light may be green light having a peak wavelength in the range from about 510 nm to 550 nm, and the third color light may be blue light having a peak wavelength in the range from about 440 nm to 480 nm, but the present disclosure is not limited thereto.

The first to third emission areas LA1, LA2, and LA3 may be sequentially arranged repetitively along the first direction (X-axis direction) in the display area DA. For example, the size of the third emission area LA3 may be larger than that of the first emission area LA1, and the size of the first emission area LA1 may be larger than that of the second emission area LA2. However, the present disclosure is not limited thereto. For another example, the first emission area LA1, the second emission area LA2, and the third emission area LA3 may be substantially the same in size.

The display area DA of the display device 10 (10-1, 10-2, 10-3, and 10-4) may include a light blocking area BA surrounding the plurality of emission areas LA. The light blocking area BA may prevent the colored lights emitted from the first to third emission areas LA1, LA2, and LA3 from mixing with one another.

The tiled display device TD may have a planar shape as a whole, but is not limited thereto. The tiled display device TD may have a three-dimensional shape to provide a three-dimensional effect to a user. For example, when the tiled display device TD has a three-dimensional shape, at least some of the plurality of display devices 10 may have a curved shape. For another example, the plurality of display devices 10 may each have a planar shape and may be connected to each other at an angle (e.g., a predetermined angle), so that the tiled display device TD may have a three-dimensional shape.

The tiled display device TD may include a bonding region SM disposed between a plurality of display areas DA. The tiled display device TD may be formed by connecting non-display areas NDA of the adjacent display devices 10 (10-1, 10-2, 10-3, and 10-4). The plurality of display devices 10 (10-1, 10-2, 10-3, and 10-4) may be connected to each other through a bonding member or an adhesive member disposed in the bonding region SM. The bonding region SM may not include a pad portion or a flexible film attached to the pad portion. Accordingly, the distance between the display areas DA of the plurality of display devices 10 (10-1, 10-2, 10-3, and 10-4) may be small enough that the bonding region SM is not recognized by the user. Further, the reflectance of external light of the display areas DA of the plurality of display devices 10 (10-1, 10-2, 10-3, and 10-4) may be substantially the same as that of the bonding region SM. Accordingly, in the tiled display device TD, the bonding region SM between the plurality of display devices 10 (10-1, 10-2, 10-3, and 10-4) may be prevented from being recognized by the user, thereby reducing a sense of disconnection between the plurality of display devices 10 (10-1, 10-2, 10-3, and 10-4) and improving a sense of immersion in an image.

FIG. 2 is a cross-sectional view taken along the line I-I' of FIG. 1. FIG. 3 is an enlarged view of an area A1 of FIG. 2.

Referring to FIGS. 2 and 3, the display area DA of the display device 10 may include first to third emission areas LA1, LA2, and LA3. Each of the first to third emission areas LA1, LA2, and LA3 may be an area in which light generated from the light emitting element ED of the display device 10 is emitted to the outside of the display device 10.

The display device 10 may include a first substrate SUB1, a laser absorption layer LAL, a first barrier insulating layer BIL1, a first metal layer MTL1, a second barrier insulating layer BIL2, a second substrate SUB2, a third barrier insulating layer BIL3, a display layer DPL, an encapsulation layer TFE, an anti-reflection film ARF, a flexible film FPCB, and a display driver DIC.

The first substrate SUB1 may support the display device 10. The first substrate SUB1 may be a base substrate or a base member. The first substrate SUB1 may be a flexible substrate which can be bent, folded, or rolled. For example, the first substrate SUB1 may include an insulating material such as a polymer resin such as polyimide (PI), but the present disclosure is not limited thereto. As another example, the first substrate SUB1 may be a rigid substrate including a glass material.

The first substrate SUB1 may include the first contact hole CNT1. The first contact hole CNT1 may be etched from the bottom surface of the first substrate SUB1 to penetrate the top surface of the first substrate SUB1. For example, the lower width of the first contact hole CNT1 may be greater than the upper width of the first contact hole CNT1. During the manufacturing process of the display device 10, a pad portion PAD inserted into a second contact hole CNT2 may be exposed through the first contact hole CNT1, and the pad portion PAD may be electrically connected to a lead electrode LDE of the flexible film FPCB through a connection film ACF inserted into the first contact hole CNT1.

The laser absorption layer LAL may be disposed on the first substrate SUB1. The laser absorption layer LAL may absorb an ultraviolet laser in an etching process of the first substrate SUB1 to prevent transmission of the ultraviolet laser. Here, the ultraviolet laser may have a wavelength of about 300 nm to 400 nm, preferably, a wavelength of about 340 nm to 350 nm. The laser absorption layer LAL may absorb the ultraviolet laser in the etching process of the first substrate SUB1 to prevent damage to the second substrate SUB2 or the display layer DPL. For example, the laser absorption layer LAL may include amorphous silicon (a-Si). The thickness of the laser absorption layer LAL may be about 300 angstroms (Å) to 1000 Å, preferably about 500 Å. The thickness of the laser absorption layer LAL may be smaller than the thickness of the first barrier insulating layers BIL1 or the second barrier insulating layer BIL2. The thickness of the laser absorption layer LAL may be smaller than the thickness of a fan-out line FOL.

The first barrier insulating layer BIL1 may be disposed on the laser absorption layer LAL. The first barrier insulating layer BIL1 may include an inorganic layer capable of preventing permeation of air or moisture. The first barrier insulating layer BIL1 may include at least one of a silicon nitride layer, a silicon oxynitride layer, a silicon oxide layer, a titanium oxide layer, an aluminum oxide layer, or an amorphous silicon layer. For example, the first barrier insulating layer BIL1 may include amorphous silicon (a-Si) having a thickness equal to or less than about 50 Å and silicon oxide (SiOx) having a thickness equal to or greater than about 3000 Å, but is not limited thereto.

The laser absorption layer LAL and the first barrier insulating layer BIL1 may include the second contact hole CNT2. The second contact hole CNT2 may be etched from the top surface of the first barrier insulating layer BIL1 and penetrate to the bottom surface of the laser absorption layer LAL. For example, the upper width of the second contact hole CNT2 may be greater than the lower width of the second contact hole CNT2.

The first metal layer MTL1 may be disposed on the first barrier insulating layer BIL1. The first metal layer MTL1 may include the fan-out line FOL. The first metal layer MTL1 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu). For example, the first metal layer MTL1 may have a thickness equal to or greater than about 1500 Å, but is not limited thereto.

The pad portion PAD may be integrally formed with the fan-out line FOL and inserted into the second contact hole CNT2. The pad portion PAD may electrically connect the flexible film FPCB to a connection portion CWL. The pad portion PAD may be exposed through the first contact hole CNT1 of the first substrate SUB1. The pad portion PAD may be electrically connected to the lead electrode LDE of the flexible film FPCB through the connection film ACF. The fan-out line FOL may be electrically connected to a data line, a power line, or a gate line through the connection portion CWL. The data line or the power line may be connected to a drain electrode DE of a thin film transistor TFT. The gate line may be connected to the gate electrode GE of the thin film transistor TFT. Accordingly, the fan-out line FOL may supply a data voltage, a power voltage, or a gate signal received from the display driver DIC of the flexible film FPCB to the thin film transistor TFT of the pixel through the connection portion CWL. The display device 10 includes the fan-out line FOL disposed in the display area DA, so that the area of the non-display area NDA may be reduced or minimized.

The pad portion PAD may absorb the ultraviolet laser in a region where the laser absorption layer LAL is not disposed, and may prevent damage to the second substrate SUB2 or the display layer DPL in the etching process of the first substrate SUB1. Accordingly, the display device 10 may include the laser absorption layer LAL and the pad portion PAD, thereby preventing damage to the second substrate SUB2 or the display layer DPL in the etching process of the first substrate SUB1.

The second barrier insulating layer BIL2 may be disposed on the first barrier insulating layer BIL1 and the first metal layer MTL1. The second barrier insulating layer BIL2 may include an inorganic layer capable of preventing permeation of air or moisture. The second barrier insulating layer BIL2 may include at least one of a silicon nitride layer, a silicon oxynitride layer, a silicon oxide layer, a titanium oxide layer, an aluminum oxide layer, or an amorphous silicon layer. For example, the second barrier insulating layer BIL2 may include silicon nitride (SiNx) having a thickness equal to or less than about 500 Å and silicon oxynitride (SiON) having a thickness equal to or greater than about 1500 Å, but is not limited thereto.

The second substrate SUB2 may be disposed on the second barrier insulating layer BIL2. The second substrate SUB2 may be a base substrate or a base member. The second substrate SUB2 may be a flexible substrate that can be bent, folded, or rolled. For example, the second substrate SUB2 may include an insulating material such as a polymer resin such as polyimide (PI), but the present disclosure is not limited thereto.

The third barrier insulating layer BIL3 may be disposed on the second substrate SUB2. The third barrier insulating layer BIL3 may include an inorganic layer capable of preventing permeation of air or moisture. For example, the third barrier insulating layer BIL3 may include at least one of a silicon nitride layer, a silicon oxynitride layer, a silicon oxide layer, a titanium oxide layer, an aluminum oxide layer, or an amorphous silicon layer, but the present disclosure is not limited thereto.

The third barrier insulating layer BIL3, the second substrate SUB2, and the second barrier insulating layer BIL2 may include a third contact hole CNT3. The third contact hole CNT3 may be etched from the top surface of the third barrier insulating layer BIL3 to penetrate the bottom surface of the second barrier insulating layer BIL2. For example, the upper width of the third contact hole CNT3 may be greater than the lower width of the third contact hole CNT3. During the manufacturing process of the display device 10, the top surface of the fan-out line FOL may be exposed through the third contact hole CNT3, and the fan-out line FOL may be in contact with the connection portion CWL inserted into the third contact hole CNT3.

The display layer DPL may be disposed on the third barrier insulating layer BIL3. The display layer DPL may include a thin film transistor layer TFTL, a light emitting element layer EML, a wavelength conversion layer WLCL and a color filter layer CFL. The thin film transistor layer TFTL may include a second metal layer MTL2, a buffer layer BF, an active layer ACTL, a gate insulating layer GI, a third metal layer MTL3, an interlayer insulating layer ILD, a fourth metal layer MTL4, a first passivation layer PV1, and a first planarization layer OC1.

The second metal layer MTL2 may be disposed on the third barrier insulating layer BIL3. The second metal layer MTL2 may include the connection portion CWL and first and second voltage lines VL1 and VL2. The connection portion CWL and the first and second voltage lines VL1 and VL2 may be formed of the same material in the same layer, but the present disclosure is not limited thereto. For example, the second metal layer MTL2 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu).

The connection portion CWL may be inserted into the third contact hole CNT3 to be connected to the fan-out line FOL. For example, the connection portion CWL may be electrically connected to the data line to supply the data voltage to the thin film transistor TFT. The connection portion CWL may be electrically connected to the power line to supply the power voltage to the thin film transistor TFT. The connection portion CWL may be electrically connected to the gate line to supply the gate signal to the gate electrode GE of the thin film transistor TFT. Accordingly, the connection portion CWL may supply the data voltage, the power voltage, or the gate signal received from the display driver DIC through the fan-out line FOL to the thin film transistor TFT of the pixel.

The first and second voltage lines VL1 and VL2 may extend in the second direction (Y-axis direction) in the display area DA. Each of the first and second voltage lines VL1 and VL2 may be electrically connected to the fan-out line FOL. Each of the first and second voltage lines VL1 and VL2 may be electrically connected to the thin film transistor TFT or the light emitting element ED. For example, each of the first and second voltage lines VL1 and VL2 may be a data line, a high potential line, a low potential line, or a sensing line, but is not limited thereto.

The buffer layer BF may be disposed on the second metal layer MTL2 and the third barrier insulating layer BIL3. The buffer layer BF may include an inorganic material capable of preventing permeation of air or moisture. For example, the buffer layer BF may include a plurality of inorganic layers laminated alternately.

The active layer ACTL may be disposed on the buffer layer BF. The active layer ACTL may include a semiconductor region ACT, a drain electrode DE, and a source electrode SE of the thin film transistor TFT. The semiconductor region ACT may overlap the gate electrode GE in the thickness direction (Z-axis direction), and may be insulated from the gate electrode GE by the gate insulating layer GI. The drain electrode DE and the source electrode SE may be provided by making a material of the semiconductor region ACT conductive. The thin film transistor TFT may constitute a pixel circuit of each of the plurality of pixels. For example, the thin film transistor TFT may be a switching transistor or a driving transistor of the pixel circuit.

The gate insulating layer GI may be disposed on the active layer ACTL and the buffer layer BF. The gate insulating layer GI may insulate the gate electrode GE from the semiconductor region ACT of the thin film transistor TFT. The gate insulating layer GI may include a contact hole through which each of the first and second connection electrodes CNE1 and CNE2 passes.

The third metal layer MTL3 may be disposed on the gate insulating layer GI. The third metal layer MTL3 may include the gate electrode GE of the thin film transistor TFT. The gate electrode GE may overlap the semiconductor region ACT in the thickness direction (Z-axis direction) with the gate insulating layer GI interposed therebetween. The gate electrode GE may receive a gate signal from the gate line. For example, the third metal layer MTL3 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu).

The interlayer insulating layer ILD may be disposed on the third metal layer MTL3 and the gate insulating layer GI. The interlayer insulating layer ILD may insulate the third and fourth metal layers MTL3 and MTL4. The interlayer insulating layer ILD may include contact holes through which each of the first and second connection electrodes CNE1 and CNE2 passes.

The fourth metal layer MTL4 may be disposed on the interlayer insulating layer ILD. The fourth metal layer MTL4 may include the first and second connection electrodes CNE1 and CNE2. The first and second connection electrodes CNE1 and CNE2 may be formed of the same material in the same layer, but the present disclosure is not limited thereto. For example, the fourth metal layer MTL4 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu).

The first connection electrode CNE1 may electrically connect the first voltage line VL1 to the drain electrode DE of the thin film transistor TFT. One end of the first connection electrode CNE1 may be in contact with the first voltage line VL1 of the second metal layer MTL2 through the interlayer insulating layer ILD, the gate insulating layer GI, and the buffer layer BF, and the other end of the first connection electrode CNE1 may be in contact with the drain electrode DE of the active layer ACTL through the interlayer insulating layer ILD and the gate insulating layer GI.

The second connection electrode CNE2 may electrically connect the source electrode SE of the thin film transistor TFT to a first electrode RME1. One end of the second connection electrode CNE2 may be in contact with the source electrode SE of the active layer ACTL through the interlayer insulating layer ILD and the gate insulating layer GI, and the other end of the second connection electrode CNE2 may be in contact with the first electrode RME1 of the light emitting element layer EML.

The first passivation layer PV1 may be disposed on the fourth metal layer MTL4 and the interlayer insulating layer ILD. The first passivation layer PV1 may protect the thin film transistor TFT. The first passivation layer PV1 may include a contact hole through which the first electrode RME1 passes.

The first planarization layer OC1 may be disposed on the first passivation layer PV1 to flatten the upper end of the thin film transistor layer TFTL. For example, the first planarization layer OC1 may include a contact hole through which the first electrode RME1 passes. Here, the contact hole of the first planarization layer OC1 may be connected to the contact hole of the first passivation layer PV1. The first planarization layer OC1 may contain an organic insulating material such as polyimide (PI).

The light emitting element layer EML may be disposed on the thin film transistor layer TFTL. The light emitting element layer EML may include a protruding pattern BP, the first electrode RME1, a second electrode RME2, a first insulating layer PAS1, a sub-bank SB, the light emitting element ED, a second insulating layer PAS2, a first contact electrode CTE1, a second contact electrode CTE2, and a third insulating layer PAS3.

The protruding pattern BP may be disposed on the first planarization layer OC1. The protruding pattern BP may protrude from the top surface of the first planarization layer OC1. A plurality of protruding patterns BP may be disposed in an opening area or the emission area LA of each of the plurality of pixels. A plurality of light emitting elements ED may be arranged between the plurality of protruding patterns BP. The protruding pattern BP may have inclined side surfaces, and the light emitted from the plurality of light emitting elements ED may be reflected by the first and second electrodes RME1 and RME2 arranged on the protruding patterns BP. For example, the protruding pattern BP may include an organic insulating material such as polyimide (PI).

The first electrode RME1 may be disposed on the first planarization layer OC1 and the protruding pattern BP. The first electrode RME1 may be disposed on the protruding pattern BP located on one side of the light emitting elements ED. The first electrode RME1 may be disposed on the inclined surfaces of the protruding pattern BP and reflect the light emitted from the light emitting element ED. The first electrode RME1 may be inserted into the contact hole provided in the first planarization layer OC1 and the first passivation layer PV1 and connected to the second connection electrode CNE2. The first electrode RME1 may be electrically connected to one end of the light emitting element ED through the first contact electrode CTE1. For example, the first electrode RME1 may receive a voltage that is proportional to the luminance of the light emitting element ED from the thin film transistor TFT of the pixel.

The second electrode RME2 may be disposed on the first planarization layer OC1 and the protruding pattern BP. The second electrode RME2 may be disposed on the protruding pattern BP located on the other side of the light emitting elements ED. The second electrode RME2 may be disposed on the inclined surfaces of the protruding pattern BP and reflect the light emitted from the light emitting element ED. The second electrode RME2 may be electrically connected to the other end of the light emitting element ED through the second contact electrode CTE2. For example, the second electrode RME2 may receive a low potential voltage supplied from a low potential line to all the pixels.

The first and second electrodes RME1 and RME2 may contain a conductive material having high reflectivity. For example, the first and second electrodes RME1 and RME2 may contain at least one of aluminum (Al), silver (Ag), copper (Cu), nickel (Ni), or lanthanum (La). For another example, the first and second electrodes RME1 and RME2 may include a material such as indium tin oxide (ITO), indium zinc oxide (IZO), and indium tin zinc oxide (ITZO). In still another example, the first and second electrodes RME1 and RME2 may contain a plurality of layers including a transparent conductive material layer and a metal layer having high reflectivity, or may include one layer containing a transparent conductive material or a metal having high reflectivity.

The first and second electrodes RME1 and RME2 may have a stacked structure of ITO/Ag/ITO, ITO/Ag/IZO, ITO/Ag/ITZO/IZO, or the like.

The first insulating layer PAS1 may be disposed on the first planarization layer OC1, and the first and second electrodes RME1 and RME2. The first insulating layer PAS1 may protect and insulate the first electrode RME1 and the second electrode RME2 from each other. The first insulating layer PAS1 may prevent damage caused by direct contact between the light emitting element ED and the first and second electrodes RME1 and RME2 in an alignment process of the light emitting element ED.

The sub-bank SB may be disposed in the light blocking area BA on the first insulating layer PAS1. The sub-bank SB may be disposed at the boundary of the plurality of pixels to distinguish the light emitting elements ED of each of the plurality of pixels. The sub-bank SB may have a suitable height (e.g., a predetermined height) and may contain an organic insulating material such as polyimide (PI).

The plurality of light emitting elements ED may be arranged on the first insulating layer PAS1. The plurality of light emitting elements ED may be arranged in parallel to each other between the first electrode RME1 and the second electrodes RME2. The length of the light emitting element ED may be greater than the distance between the first electrode RME1 and the second electrodes RME2. The light emitting element ED may include a plurality of semiconductor layers, and one end thereof may be defined with respect to the first semiconductor layer, and the other end thereof opposite to the one end may be defined with respect to the second semiconductor layer. One end of the light emitting element ED may be disposed on the first electrode RME1, and the other end of the light emitting element ED may be disposed on the second electrode RME2. One end of the light emitting element ED may be electrically connected to the first electrode RME1 through the first contact electrode CTE1, and the other end of the light emitting element ED may be electrically connected to the second electrode RME2 through the second contact electrode CTE2.

The light emitting element ED may have a micro-meter or nano-meter size, and may be an inorganic light emitting diode including an inorganic material. The light emitting element ED may be aligned between the first electrode RME1 and the second electrode RME2 opposing each other by the electric field formed in a specific direction between the first electrode RME1 and the second electrode RME2.

For example, a plurality of light emitting elements ED may include active layers having the same material and emit light of the same wavelength band or light of the same color. The lights emitted from the first to third emission areas LA1, LA2, and LA3 of the light emitting element layer EML may have the same color. For example, the plurality of light emitting elements ED may emit light of a third color or blue light having a peak wavelength in the range of about 440 nm to 480 nm, but the present disclosure is not limited thereto.

The second insulating layer PAS2 may be disposed on the plurality of light emitting elements ED. For example, the second insulating layer PAS2 may be partially around (e.g., may partially surround) the plurality of light emitting elements ED and may not cover both ends of the plurality of light emitting elements ED. The second insulating layer PAS2 may protect the plurality of light emitting elements ED, and may fix the plurality of light emitting elements ED in the manufacturing process of the display device 10. The second insulating layer PAS2 may fill the space between the light emitting element ED and the first insulating layer PAS1.

The first contact electrode CTE1 may be disposed on the first insulating layer PAS1, and may be connected to the first electrode RME1 while being inserted into a contact hole provided in the first insulating layer PAS1. For example, the contact hole of the first insulating layer PAS1 may be disposed on the protruding pattern BP, but the present disclosure is not limited thereto. One end of the first contact electrode CTE1 may be connected to the first electrode RME1 on the protruding pattern BP, and the other end of the first contact electrode CTE1 may be connected to one end of the light emitting element ED.

The second contact electrode CTE2 may be disposed on the first insulating layer PAS1, and may be connected to the second electrode RME2 while being inserted into a contact hole provided in the first insulating layer PAS1. For example, the contact hole of the first insulating layer PAS1 may be disposed on the protruding pattern BP, but the present disclosure is not limited thereto. One end of the second contact electrode CTE2 may be connected to the other end of the light emitting element ED, and the other end of the second contact electrode CTE2 may be connected to the second electrode RME2 on the protruding pattern BP.

The third insulating layer PAS3 may be disposed on the first and second contact electrodes CTE1 and CTE2, the sub-bank SB, and the first and second insulating layers PAS1 and PAS2. The third insulating layer PAS3 may be disposed at the upper end of the light emitting element layer EML to protect the light emitting element layer EML.

The wavelength conversion layer WLCL may be disposed on the light emitting element layer EML. The wavelength conversion layer WLCL may include a first light blocking member BK1, a first wavelength conversion member WLC1, a second wavelength conversion member WLC2, a light transmission member LTU, a second passivation layer PV2, a second planarization layer OC2, or the like.

The first light blocking member BK1 may be disposed in the light blocking area BA on the third insulating layer PAS3. The first light blocking member BK1 may overlap the sub-bank SB in the thickness direction (Z-axis direction). The first light blocking member BK1 may block transmission of light. The first light blocking member BK1 may prevent light infiltration and color mixture between the first to third emission areas LA1, LA2, and LA3, which leads to the improvement of color reproducibility of the display device 10. The first light blocking member BK1 may be arranged in the form of a grid surrounding the first to third emission areas LA1, LA2, and LA3 in a plan view.

The first wavelength conversion member WLC1 may be disposed in the first emission area LA1 on the third insulating layer PAS3. The first wavelength conversion member WLC1 may be surrounded by the first light blocking member BK1. The first wavelength conversion member WLC1 may change or shift the peak wavelength of the incident light to a first peak wavelength. The first wavelength conversion member WLC1 may include a first based resin BS1, a first scatterer SCT1, and a first wavelength shifter WLS1.

The first base resin BS1 may contain a material having a relatively high light transmittance. The first base resin BS1 may be formed of a transparent organic material. For example, the first base resin BS1 may contain at least one of organic materials such as epoxy resin, acrylic resin, cardo resin, or imide resin.

The first scatterer SCT1 may have a refractive index different from that of the first base resin BS1 and form an optical interface with the first base resin BS1. For example, the first scatterer SCT1 may contain a light scattering material or light scattering particles that scatter at least a portion of the transmitted light. For example, the first scatterer SCT1 may contain a metallic oxide such as titanium oxide ($TiO_2$), zirconium oxide ($ZrO_2$), aluminum oxide ($AL_2O_3$), indium oxide ($In_2O_3$), zinc oxide (ZnO), or tin oxide ($SnO_2$), or may contain organic particles such as acrylic resin and urethane resin. The first scatterer SCT1 may scatter light in random directions regardless of the incidence direction of the incident light without any substantial change of the peak wavelength of the incident light.

The first wavelength shifter WLS1 may change or shift the peak wavelength of the incident light to a first peak wavelength. For example, the first wavelength shifter WLS1 may convert blue light provided from the display device 10 into red light having a single peak wavelength in the range of about 610 nm to 650 nm and emit the red light. The first wavelength shifter WLS1 may be a quantum dot, a quantum rod, or a fluorescent substance. The quantum dot may be a particulate material that emits light of a specific color when an electron transitions from a conduction band to a valence band.

A portion of the blue light emitted from the light emitting element layer EML may pass through the first wavelength conversion member WLC1 without being converted to red light by the first wavelength shifter WLS1. Among the blue light emitted from the light emitting element layer EML, the light incident on the first color filter CF1 without being converted by the first wavelength conversion member WLC1 may be blocked by the first color filter CF1. The red light produced by the first wavelength conversion member WLC1 converting the blue light emitted from the light emitting element layer EML may pass through the first color filter CF1 to be emitted to the outside. Accordingly, the red light may be emitted through the first emission area LA1.

The second wavelength conversion member WLC2 may be disposed in the second emission area LA2 on the third insulating layer PAS3. The second wavelength conversion member WLC2 may be surrounded by the first light blocking member BK1. The second wavelength conversion member WLC2 may change or shift the peak wavelength of the incident light to a second peak wavelength. The second wavelength conversion member WLC2 may include a second base resin BS2, a second scatterer SCT2, and a second wavelength shifter WLS2.

The second base resin BS2 may contain a material having a relatively high light transmittance. The second base resin BS2 may be formed of a transparent organic material. For example, the second base resin BS2 may be made of the same material as the first base resin BS1, or may be made of the material exemplified in association with the first base resin BS1.

The second scatterer SCT2 may have a refractive index different from that of the second base resin BS2 and form an optical interface with the second base resin BS2. For example, the second scatterer SCT2 may contain a light scattering material or light scattering particles scattering at least a portion of the transmitted light. For example, the second scatterer SCT2 may be made of the same material as the first scatterer SCT1, or may be made of the material exemplified in association with the first scatterer SCT1.

The second wavelength shifter WLS2 may change or shift the peak wavelength of the incident light to a second peak wavelength different from the first peak wavelength of the first wavelength shifter WLS1. For example, the second wavelength shifter WLS2 may convert blue light provided from the display device 10 into green light having a single peak wavelength in the range of about 510 nm to 550 nm and emit the green light. The second wavelength shifter WLS2 may be a quantum dot, a quantum rod, or a fluorescent substance. The second wavelength shifter WLS2 may contain the materials exemplified in association with the first wavelength shifter WLS1. The second wavelength shifter WLS2 may be formed of a quantum dot, a quantum rod, or a fluorescent substance to have a wavelength conversion range different from that of the first wavelength shifter WLS1.

The light transmission member LTU may be disposed in the third emission area LA3 on the third insulating layer PAS3. The light transmission member LTU may be surrounded by the first light blocking member BK1. The light transmission member LTU may allow the incident light to pass therethrough while maintaining the peak wavelength of the light. The light transmission member LTU may include a third base resin BS3 and a third scatterer SCT3.

The third base resin BS3 may contain a material having a relatively high light transmittance. The third base resin BS3 may be formed of a transparent organic material. For example, the third base resin BS3 may be made of the same material as the first base resin BS1 or the second base resin BS2, or may be made of the material exemplified in association with the first base resin BS1.

The third scatterer SCT3 may have a refractive index different from that of the third base resin BS3 and form an optical interface with the third base resin BS3. For example, the third scatterer SCT3 may contain a light scattering material or light scattering particles scattering at least a portion of the transmitted light. For example, the third scatterer SCT3 may be formed of the same material as the first scatterer SCT1 or the second scatterer SCT2, or may be made of the material exemplified in association with the first scatterer SCT1.

Because the wavelength conversion layer WLCL is disposed directly on the third insulating layer PAS3 of the light emitting element layer EML, the display device 10 may not require a separate substrate for the first and second wavelength conversion members WLC1 and WLC2 and the light transmission member LTU. Accordingly, the first and second wavelength conversion members WLC1 and WLC2 and the light transmission member LTU may be easily aligned in the first to third emission areas LA1, LA2, and LA3, respectively, and the thickness of the display device 10 may be relatively reduced.

The second passivation layer PV2 may cover the first and second wavelength conversion members WLC1 and WLC2, the light transmission member LTU, and the first light blocking member BK1. For example, the second passivation layer PV2 may seal the first and second wavelength conversion members WLC1 and WLC2 and the light transmission member LTU to prevent the first and second wavelength conversion members WLC1 and WLC2 and the light transmission member LTU from damage or contamination. For example, the second passivation layer PV2 may contain an inorganic material.

The second planarization layer OC2 may be disposed on the second passivation layer PV2 to flatten the upper ends of the first and second wavelength conversion members WLC1 and WLC2 and the light transmission member LTU. For example, the second planarization layer OC2 may contain an organic insulating material such as polyimide (PI).

The color filter layer CFL may be disposed on the wavelength conversion layer WLCL. The color filter layer CFL may include a second light blocking member BK2, first to third color filters CF1, CF2, and CF3, and a third passivation layer PV3.

The second light blocking member BK2 may be disposed in the light blocking area BA on the second planarization layer OC2 of the wavelength conversion layer WLCL. The second blocking member BK2 may overlap the first blocking member BK1 or the sub-bank SB in the thickness direction (Z-axis direction). The second light blocking member BK2 may block transmission of light. The second light blocking member BK2 may prevent light infiltration and color mixture between the first to third emission areas LA1, LA2, and LA3, which leads to the improvement of color reproducibility of the display device 10. The second light blocking member BK2 may be arranged in the form of a grid surrounding the first to third emission areas LA1, LA2, and LA3 in a plan view.

The first color filter CF1 may be disposed in the first emission area LA1 on the second planarization layer OC2. The first color filter CF1 may be surrounded by the second light blocking member BK2. The first color filter CF1 may overlap the first wavelength conversion member WLC1 in the thickness direction (Z-axis direction). The first color filter CF1 may selectively allow the first color light (e.g., red light) to pass therethrough, and block or absorb the second color light (e.g., green light) and the third color light (e.g., blue light). For example, the first color filter CF1 may be a red color filter and contain a red colorant.

The second color filter CF2 may be disposed in the second emission area LA2 on the second planarization layer OC2. The second color filter CF2 may be surrounded by the second light blocking member BK2. The second color filter CF2 may overlap the second wavelength conversion member WLC2 in the thickness direction (Z-axis direction). The second color filter CF2 may selectively allow the second color light (e.g., green light) to pass therethrough, and block or absorb the first color light (e.g., red light) and the third color light (e.g., blue light). For example, the second color filter CF2 may be a green color filter and contain a green colorant.

The third color filter CF3 may be disposed in the third emission area LA3 on the second planarization layer OC2. The third color filter CF3 may be surrounded by the second light blocking member BK2. The third color filter CF3 may overlap the light transmission member LTU in the thickness direction (Z-axis direction). The third color filter CF3 may selectively allow the third color light (e.g., blue light) to pass therethrough, and block or absorb the first color light (e.g., red light) and the second color light (e.g., green light). For example, the third color filter CF3 may be a blue color filter and contain a blue colorant.

The first to third color filters CF1, CF2, and CF3 may absorb a portion of the light coming from the outside of the display device 10 to reduce the reflected light of the external light. Thus, the first to third color filters CF1, CF2, and CF3 can prevent color distortion caused by the reflection of the external light.

Because the first to third color filters CF1, CF2, and CF3 are directly disposed on the second planarization layer OC2 of the wavelength conversion layer WLCL, the display device 10 may not require a separate substrate for the first to third color filters CF1, CF2, and CF3. Therefore, the thickness of the display device 10 may be relatively reduced.

The third passivation layer PV3 may cover the first to third color filters CF1, CF2, and CF3, and the second light blocking member BK2. The third passivation layer PV3 may protect the first to third color filters CF1, CF2, and CF3.

The encapsulation layer TFE may be disposed on the third passivation layer PV3 of the color filter layer CFL. The encapsulation layer TFE may cover the top and side surfaces of the display layer DPL. For example, the encapsulation layer TFE may include at least one inorganic layer to prevent permeation of oxygen or moisture. In addition, the encapsulation layer TFE may include at least one organic layer to protect the display device 10 from foreign substances such as dust.

The anti-reflection film ARF may be disposed on the encapsulation layer TFE. The anti-reflection film ARF may prevent reflection of external light, thereby reducing a decrease in visibility due to reflection of external light. The anti-reflection film ARF may protect the top surface of the display device 10. The anti-reflection film ARF may be omitted. For another example, the anti-reflection film ARF may be replaced with a polarizing film.

The flexible film FPCB may be disposed under the first substrate SUB1. The flexible film FPCB may be disposed on the edge of the bottom surface of the display device 10. The flexible film FPCB may be attached to the bottom surface of the first substrate SUB1 using the adhesive member ADM. The flexible film FPCB may include the lead electrode LDE disposed on the top surface of one side. The lead electrode LDE may be inserted into the first contact hole CNT1 to be electrically connected to the pad portion PAD through the connection film ACF. The flexible film FPCB may support the display driver DIC disposed on the bottom surface thereof on the other side. The lead electrode LDE may be electrically connected to the display driver DIC through a lead line disposed on the bottom surface of the flexible film FPCB. The other side of the flexible film FPCB may be connected to a source circuit board under the first substrate SUB1. The flexible film FPCB may transmit a signal and a voltage of the display driver DIC to the display device 10.

The connection film ACF may attach the lead electrode LDE of the flexible film FPCB to the pad portion PAD. One surface of the connection film ACF may be attached to the pad portion PAD, and the other surface of the connection film ACF may be attached to the lead electrode LDE. For example, the connection film ACF may include an anisotropic conductive film. When the connection film ACF includes the anisotropic conductive film, the connection film ACF may have conductivity in a region where the pad portion PAD and the lead electrode LDE are in contact with each other, and may electrically connect the flexible film FPCB to the fan-out line FOL.

The display driver DIC may be mounted on the flexible film FPCB. The display driver DIC may be an integrated circuit (IC). The display driver DIC may convert digital video data into an analog data voltage based on the data control signal received from a timing controller, and supply the analog data voltage to the data line of the display area DA through the flexible film FPCB. The display driver DIC may supply the power voltage received from a power supply unit to the power line of the display area DA through the flexible film FPCB. The display driver DIC may generate a plurality of gate signals based on the gate control signal, and may sequentially supply the plurality of gate signals to the plurality of gate lines according to a set order. The display device 10 includes the fan-out line FOL disposed on the first substrate SUB1 and the display driver DIC disposed under the first substrate SUB1, so that the area of the non-display area NDA may be reduced or minimized.

FIG. 4 is a graph illustrating transmittance of a laser absorption layer depending on a wavelength of light in a display device according to one or more embodiments.

Referring to FIG. 4, when the thickness of the laser absorption layer LAL is 30 nm or 300 Å, the transmittance of light having a wavelength equal to or less than about 300 nm may be close to zero. When the thickness of the laser absorption layer LAL is 60 nm or 600 Å, the transmittance of light having a wavelength equal to or less than about 360 nm may be close to zero. When the thickness of the laser absorption layer LAL is 150 nm or 1500 Å, the transmittance of light having a wavelength equal to or less than about 550 nm may be close to zero. When the thickness of the laser absorption layer LAL is 200 nm or 2000 Å, the transmittance of light having a wavelength equal to or less than about 640 nm may be close to zero. When the thickness of the laser absorption layer LAL is 400 nm or 4000 Å, the transmittance of light having a wavelength equal to or less than about 640 nm may be close to zero.

Accordingly, the display device 10 may include the laser absorption layer LAL having a thickness of about 300 Å to 1000 Å, preferably about 500 Å to absorb an ultraviolet laser in the etching process of the first substrate SUB1, thereby preventing or reducing damage to the second substrate SUB2 or the display layer DPL.

FIG. 5 is a bottom view illustrating a display device according to one or more embodiments. FIG. 6 is an enlarged bottom view illustrating a portion of a display device according to one or more embodiments.

Referring to FIGS. 5 and 6, the flexible film FPCB, the pad portion PAD, and the fan-out line FOL may be disposed in the display area DA.

The flexible film FPCB may be disposed under the first substrate SUB1. The flexible film FPCB may be disposed on the edge of the bottom surface of the display device 10. For example, a portion of the flexible film FPCB may be disposed on the edge of the long side of the display device 10, and another portion of the flexible film FPCB may be disposed on the edge of the short side of the display device 10. The flexible film FPCB disposed at the edge of the long side of the display device 10 may supply the data voltage and the power voltage, and the flexible film FPCB disposed at the edge of the short side of the display device 10 may supply the gate signal, but the present disclosure is not limited thereto.

The flexible film FPCB may include the lead electrode LDE. The plurality of pad portions PAD may respectively correspond to the plurality of lead electrodes LDE. The lead electrode LDE may be electrically connected to the pad portion PAD through the connection film ACF.

The pad portion PAD may be inserted into the second contact hole CNT2 of the laser absorption layer LAL and the first barrier insulating layer BIL1, and may be exposed through the first contact hole CNT1. The pad portions PAD disposed at the edge of the long side of the display device 10 may be arranged along the first direction (X-axis direction). The pad portions PAD disposed at the edge of the short side of the display device 10 may be arranged along the second direction (Y-axis direction).

The fan-out line FOL may be integrally formed with the pad portion PAD. The fan-out line FOL may extend from the pad portion PAD to the edge of the display device 10. For example, the fan-out line FOL disposed at the edge of the long side of the display device 10 may extend in a direction opposite to the second direction (Y-axis direction) of the flexible film FPCB. The fan-out line FOL disposed at the edge of the short side of the display device 10 may extend in a direction opposite to the first direction (X-axis direction) of the flexible film FPCB. The fan-out line FOL may be electrically connected to the data line or the gate line of the display area DA through the connection portion CWL.

FIG. 7 is a diagram illustrating a pad portion, a fan-out line, a sensing line, and a data line in a display device according to one or more embodiments. FIG. 8 is a diagram illustrating a pad portion, a power connection line, a high potential line, and a horizontal voltage line in a display device according to one or more embodiments. FIG. 9 is a diagram illustrating a pad portion, a power connection line, a low potential line, and a vertical voltage line in a display device according to one or more embodiments. FIG. 10 is a diagram illustrating a pad portion, a fan-out line, and a gate line in a display device according to one or more embodiments.

Referring to FIGS. 7 to 10, the display area DA may include sensing lines SL, data lines DL, high potential lines VDL, horizontal voltage lines HVDL, low potential lines VSL, vertical voltage lines VVSL, and gate lines GL.

The plurality of sensing lines SL may extend in the second direction (Y-axis direction) and may be spaced from each other in the first direction (X-axis direction). Referring also to FIG. 2, the sensing line SL may be disposed in the second metal layer MTL2 and extend in the second direction (the Y-axis direction). The sensing line SL may be electrically connected to the fan-out line FOL of the first metal layer MTL1 through the connection portion CWL. The sensing line SL may cross the fan-out line FOL in a plan view. The sensing line SL may receive an initialization voltage through the pad portion PAD. The sensing line SL may provide a sensing signal to the pad portion PAD.

The data lines DL may include first to third data lines DL1, DL2, and DL3. The first to third data lines DL1, DL2, and DL3 may extend in the second direction (Y-axis direction) and may be spaced from each other in the first direction (X-axis direction). Referring also to FIG. 2, the data line DL may be disposed in the second metal layer MTL2 and extend in the second direction (the Y-axis direction). The data line DL may be electrically connected to the fan-out line FOL of the first metal layer MTL1 through the connection portion CWL. The data line DL may cross the fan-out line FOL in a plan view. The data line DL may receive the data voltage through the pad portion PAD.

The plurality of high potential lines VDL may extend in the second direction (Y-axis direction) and may be spaced from each other in the first direction (X-axis direction). The high potential lines VDL may be connected to horizontal voltage lines HVDL crossing them, and may supply a high potential voltage to the horizontal voltage lines HVDL. Referring also to FIG. 2, the high potential line VDL may be disposed in the second metal layer MTL2 and extend in the second direction (Y-axis direction). The high potential line VDL may be electrically connected to a power connection line VCL of the first metal layer MTL1 through the connection portion CWL. The high potential line VDL may receive a high potential voltage through the pad portion PAD.

The plurality of horizontal voltage lines HVDL may extend in the first direction (X-axis direction) and may be spaced from each other in the second direction (Y-axis direction). The horizontal voltage lines HVDL may be connected to the high potential lines VDL crossing them, and may receive a high potential voltage from the high potential lines VDL. Referring also to FIG. 2, the horizontal voltage line HVDL may be disposed in the fourth metal layer MTL4 and extend in the first direction (X-axis direction).

The plurality of vertical voltage lines VVSL may extend in the second direction (Y-axis direction) and may be spaced from each other in the first direction (X-axis direction). The vertical voltage lines VVSL may be connected to the low potential lines VSL crossing them, and may supply a low potential voltage to the low potential lines VSL. Referring also to FIG. 2, the vertical voltage line VVSL may be disposed in the second metal layer MTL2 and extend in the second direction (Y-axis direction). The vertical voltage line VVSL may be electrically connected to the power connection line VCL of the first metal layer MTL1 through the connection portion CWL. The vertical voltage line VVSL may receive a low potential voltage through the pad portion PAD.

The plurality of low potential lines VSL may extend in the first direction (X-axis direction) and may be spaced from each other in the second direction (Y-axis direction). The low potential lines VSL may be connected to the vertical voltage lines VVSL crossing them, and may receive a low potential voltage from the vertical voltage lines VVSL. Referring also to FIG. 2, the low potential line VSL may be disposed in the fourth metal layer MTL4 and extend in the first direction (X-axis direction).

The plurality of gate lines GL may extend in the first direction (X-axis direction) and may be spaced from each other in the second direction (Y-axis direction). Referring also to FIG. 2, the gate line GL may be disposed in the third metal layer MTL3 or the fourth metal layer MTL4 and extend in the first direction (X-axis direction). The gate line GL may be electrically connected to the fan-out line FOL of the first metal layer MTL1 through the connection portion CWL. The gate line GL may cross the fan-out line FOL in a plan view. The gate line GL may receive the gate signal through the pad portion PAD.

FIG. 11 is a block diagram illustrating pixels and lines in a display device according to one or more embodiments. FIG. 12 is a circuit diagram illustrating the pixel of FIG. 11.

Referring to FIGS. 11 and 12, the pixels SP may include first to third pixels SP1, SP2, and SP3. The pixel circuits of the first pixel SP1, the third pixel SP3, and the second pixel SP2 may be arranged in the opposite direction of the second direction (Y-axis direction), but the arrangement direction of the pixel circuits is not limited thereto.

Each of the first to third pixels SP1, SP2, and SP3 may be connected to the high potential line VDL, the sensing line SL, the gate line GL, and the data line DL.

The high potential line VDL may extend in the second direction (Y-axis direction). The high potential line VDL may be disposed on the left side of the pixel circuits of the first to third pixels SP1, SP2, and SP3. The high potential line VDL may supply a high potential voltage to a transistor of each of the first to third pixels SP1, SP2, and SP3.

The horizontal voltage line HVDL may extend in the first direction (X-axis direction). The horizontal voltage line HVDL may be disposed on the upper side of the pixel circuit of the first pixel SP1. The horizontal voltage line HVDL may be connected to the high potential line VDL. The horizontal voltage line HVDL may receive a high potential voltage from the high potential line VDL.

A sensing line SL may extend in the second direction (Y-axis direction). The sensing line SL may be disposed on the left side of the high potential line VDL. The sensing line SL may supply an initialization voltage to the pixel circuit of each of the first to third pixels SP1, SP2, and SP3. The sensing line SL may receive a sensing signal from the pixel circuit of each of the first to third pixels SP1, SP2, and SP3 to supply the sensing signal the display driver DIC.

A gate line GL may extend in the first direction (X-axis direction). Referring also to FIG. 2, the gate line GL may be disposed in the third metal layer MTL3 or the fourth metal layer MTL4. The gate line GL may be disposed on the lower side of the pixel circuit of the second pixel SP2. The gate line GL may be disposed on the upper side of the low potential line VSL. The gate line GL may supply the gate signal to an auxiliary gate line BGL.

The auxiliary gate line BGL may extend from the gate line GL in the second direction (Y-axis direction). Referring also to FIG. 2, the auxiliary gate line BGL may be disposed in the third metal layer MTL3. A portion of the auxiliary gate line BGL may be the gate electrode GE of a second transistor ST2 (e.g., see FIG. 12), and another portion of the auxiliary gate line BGL may be the gate electrode GE of a third transistor ST3 (e.g., see FIG. 12). The auxiliary gate line BGL may be disposed on the right side of the pixel circuits of the first to third pixels SP1, SP2, and SP3. The auxiliary gate line BGL may supply the gate signals received from the gate line GL to the pixel circuits of the first to third pixels SP1, SP2, and SP3.

The data line DL may extend in the second direction (Y-axis direction). The data line DL may supply a data voltage to the pixel SP. The data lines DL may include first to third data lines DL1, DL2, and DL3.

The first data line DL1 may extend in the second direction (Y-axis direction). The first data line DL1 may be disposed on the right side of the auxiliary gate line BGL. The first data line DL1 may supply the data voltage received from the display driver DIC to the pixel circuit of the first pixel SP1.

The second data line DL2 may extend in the second direction (Y-axis direction). The second data line DL2 may be disposed on the right side of the first data line DL1. The second data line DL2 may supply the data voltage received from the display driver DIC to the pixel circuit of the second pixel SP2.

The third data line DL3 may extend in the second direction (Y-axis direction). The third data line DL3 may be disposed on the right side of the second data line DL2. The third data line DL3 may supply the data voltage received from the display driver DIC to the pixel circuit of the third pixel SP3.

The vertical voltage line VVSL may extend in the second direction (Y-axis direction). The vertical voltage line VVSL may be disposed on the right side of the third data line DL3. The vertical voltage line VVSL may be connected to the low potential line VSL and may supply a low potential voltage to the low potential line VSL.

The low potential line VSL may extend in the first direction (X-axis direction). The low potential line VSL may be disposed on the lower side of the gate line GL. The low potential line VSL may supply the low potential voltage received from the vertical voltage line VVSL to the light emitting element ED of the first to third pixels SP1, SP2, and SP3.

Each of the first to third pixels SP1, SP2, and SP3 may include the pixel circuit and the light emitting element ED. The pixel circuit of each of the first to third pixels SP1, SP2, and SP3 may include first to third transistors ST1, ST2, and ST3 and a first capacitor C1.

The first transistor ST1 may include a gate electrode, a drain electrode, and a source electrode. The gate electrode of the first transistor ST1 may be connected to a first node N1, the drain electrode thereof may be connected to the high potential line VDL, and the source electrode thereof may be connected to a second node N2. The first transistor ST1 may control a drain-source current (or driving current) based on a data voltage applied to the gate electrode.

The light emitting element ED may include at least one light emitting element ED. When the light emitting element ED includes the plurality of light emitting elements ED, the plurality of light emitting elements ED may be connected in series and/or in parallel. The light emitting element ED may receive a driving current from the first transistor ST1 to emit light. The light emission amount or the luminance of the light emitting element ED may be proportional to the magnitude of the driving current. The light emitting element ED may be an inorganic light emitting element including an inorganic semiconductor, but is not limited thereto.

The first electrode of the light emitting element ED may be connected to the second node N2, and the second electrode of the light emitting element ED may be connected to the low potential line VSL. The first electrode of the light emitting element ED may be connected to the source electrode of the first transistor ST1, the drain electrode of the third transistor ST3, and the second capacitor electrode of the first capacitor C1, through the second node N2.

The second transistor ST2 may be turned on by the gate signal of the gate line GL to electrically connect the data line DL to the first node N1 which is the gate electrode of the first transistor ST1. The second transistor ST2 may be turned on according to the gate signal to supply the data voltage to the first node N1. The gate electrode of the second transistor ST2 may be connected to the gate line GL, the drain electrode thereof may be connected to the data line DL, and the source electrode thereof may be connected to the first node N1.

The third transistor ST3 may be turned on by the gate signal of the gate line GL to electrically connect the sensing line SL to the second node N2 which is the source electrode of the first transistor ST1. When the third transistor ST3 is turned on in response on the gate signal, the initialization voltage may be supplied to the second node N2 and the sensing signal may be supplied to the sensing line SL. The gate electrode of the third transistor ST3 may be connected to the gate line GL, the drain electrode thereof may be connected to the second node N2, and the source electrode thereof may be connected to the sensing line SL.

FIG. 13 is a cross-sectional view taken along the line II-II' of FIG. 1.

Referring to FIG. 13, the tiled display device TD may include the plurality of display devices 10 and a bonding member 20. The tiled display device TD may include first to fourth display devices 10-1 to 10-4 (e.g., see FIG. 1). The number and connection relationship of the display devices 10 are not limited to the embodiment of FIG. 1. The number of the display devices 10 may be determined according to the size of each of the display devices 10 and the tiled display device TD.

The display device 10 may include a display area DA and a non-display area NDA. The display area DA may include a plurality of pixels SP to display an image. The non-display area NDA may be disposed around the display area DA to surround the display area DA, and may not display an image.

The tiled display device TD may include a bonding region SM disposed between a plurality of display areas DA. The tiled display device TD may be formed by connecting non-display areas NDA of the adjacent display devices 10. The plurality of display devices 10 may be connected to each other through the bonding member 20 or an adhesive member disposed in the bonding region SM. The bonding region SM of each of the plurality of display devices 10 may not include a pad member or a fan-out line connected to the pad member. Accordingly, the distance between the display areas DA of the plurality of display devices 10 may be small enough that the bonding region SM is not recognized by the user. Further, the reflectance of external light of the display areas DA of the plurality of display devices 10 may be substantially the same as that of the bonding region SM. Accordingly, in the tiled display device TD, the bonding region SM between the plurality of display devices 10 may be prevented from being recognized by the user, thereby reducing a sense of disconnection between the plurality of display devices 10 and improving a sense of immersion in an image.

The tiled display device TD may bond the side surfaces of the adjacent display devices 10 to each other by using the bonding member 20 disposed between the plurality of display devices 10. The bonding member 20 may connect the side surfaces of the first to fourth display devices 10-1 to 10-4 arranged in a grid form to implement the tiled display device TD. The bonding member 20 may bond the side surfaces of adjacent display devices 10 to each other, specifically, the side surfaces of the first substrates SUB1, the side surfaces of the laser absorption layers LAL, the side surfaces of the first and second barrier insulating layers BIL1 and BIL2, the side surfaces of the second substrates SUB2, the side surfaces of the third barrier insulating layers BIL3, the side surfaces of the display layer DPL, the side surfaces of the encapsulation layers TFE, and the side surfaces of the anti-reflection films ARF.

For example, the bonding member 20 may be made of an adhesive or a double-sided tape having a relatively thin thickness to reduce or minimize the gap between the plurality of display devices 10. For another example, the bonding member 20 may be formed of a bonding frame having a relatively thin thickness to reduce or minimize the gap between the plurality of display devices 10. Accordingly, in the tiled display device TD, it is possible to prevent the user from recognizing the bonding region SM between the plurality of display devices 10.

FIGS. 14 to 20 are cross-sectional views illustrating a process of fabricating a display device according to one or more embodiments.

Figure 14:
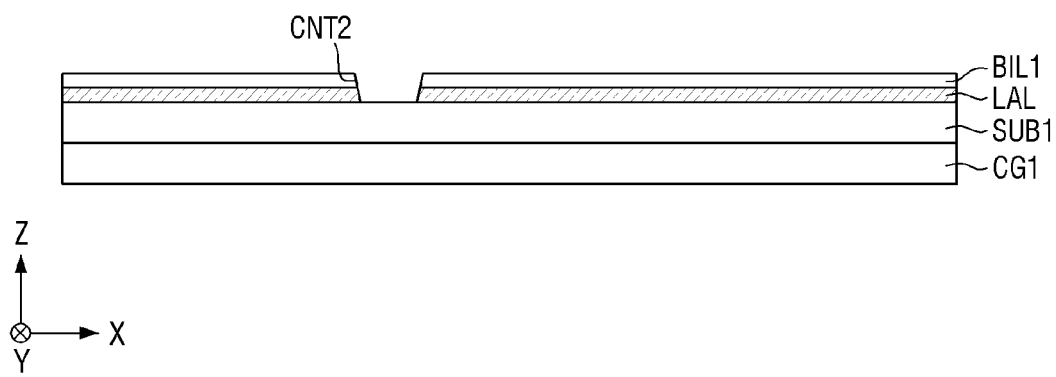

In FIG. 14, a first carrier substrate CG1 may support the display device 10 in the manufacturing process of the display device 10. For example, the first carrier substrate CG1 may be a carrier glass, but is not limited thereto.

The first substrate SUB1 may be disposed on the first carrier substrate CG1. The first substrate SUB1 may be a base substrate or a base member. For example, the first substrate SUB1 may include an insulating material such as a polymer resin such as polyimide (PI), but the present disclosure is not limited thereto.

The laser absorption layer LAL may be disposed on the first substrate SUB1. The laser absorption layer LAL may absorb an ultraviolet laser to prevent transmission of the ultraviolet laser. Here, the ultraviolet laser may have a wavelength of about 300 nm to 400 nm, preferably, a wavelength of about 340 nm to 350 nm. For example, the laser absorption layer LAL may include amorphous silicon (a-Si). The thickness of the laser absorption layer LAL may be about 300 Å to 1000 Å, preferably about 500 Å.

The first barrier insulating layer BIL1 may be disposed on the laser absorption layer LAL. The first barrier insulating layer BIL1 may include an inorganic layer capable of preventing permeation of air or moisture. The first barrier insulating layer BIL1 may include at least one of a silicon nitride layer, a silicon oxynitride layer, a silicon oxide layer, a titanium oxide layer, an aluminum oxide layer, or an amorphous silicon layer. For example, the first barrier insulating layer BIL1 may include amorphous silicon (a-Si) having a thickness equal to or less than about 50 Å and silicon oxide (SiOx) having a thickness equal to or greater than about 3000 Å, but is not limited thereto.

The laser absorption layer LAL and the first barrier insulating layer BIL1 may include the second contact hole CNT2. The second contact hole CNT2 may be etched from the top surface of the first barrier insulating layer BIL1 and penetrate to the bottom surface of the laser absorption layer LAL. The second contact hole CNT2 may expose a portion of the first substrate SUB1. For example, the upper width of the second contact hole CNT2 may be greater than the lower width of the second contact hole CNT2.

Figure 15:
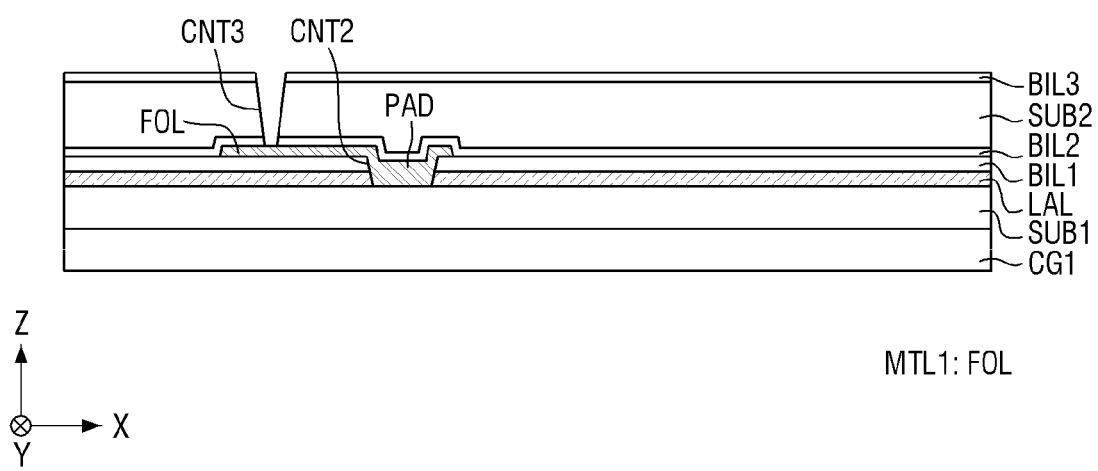

In FIG. 15, the first metal layer MTL1 may be disposed on the first barrier insulating layer BIL1. The first metal layer MTL1 may include the fan-out line FOL. The pad portion PAD may be integrally formed with the fan-out line FOL and inserted into the second contact hole CNT2. The first metal layer MTL1 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu). For example, the first metal layer MTL1 may have a thickness equal to or greater than about 1500 Å, but is not limited thereto.

The second barrier insulating layer BIL2 may be disposed on the first barrier insulating layer BIL1 and the fan-out line FOL. The second barrier insulating layer BIL2 may include an inorganic layer capable of preventing permeation of air or moisture. The second barrier insulating layer BIL2 may include at least one of a silicon nitride layer, a silicon oxynitride layer, a silicon oxide layer, a titanium oxide layer, an aluminum oxide layer, or an amorphous silicon layer. For example, the second barrier insulating layer BIL2 may include silicon nitride (SiNx) having a thickness equal to or less than about 500 Å and silicon oxynitride (SiON) having a thickness equal to or greater than about 1500 Å, but is not limited thereto.

The second substrate SUB2 and the third barrier insulating layer BIL3 may be sequentially stacked on the second barrier insulating layer BIL2. The third contact hole CNT3 may be etched from the top surface of the third barrier insulating layer BIL3 to penetrate the bottom surface of the second barrier insulating layer BIL2. For example, the second and third barrier insulating layers BIL2 and BIL3 and the second substrate SUB2 may be penetrated by a dry etching process or a wet etching process, but the present disclosure is not limited thereto. The top surface of the fan-out line FOL may be exposed by the third contact hole CNT3.

Figure 16:
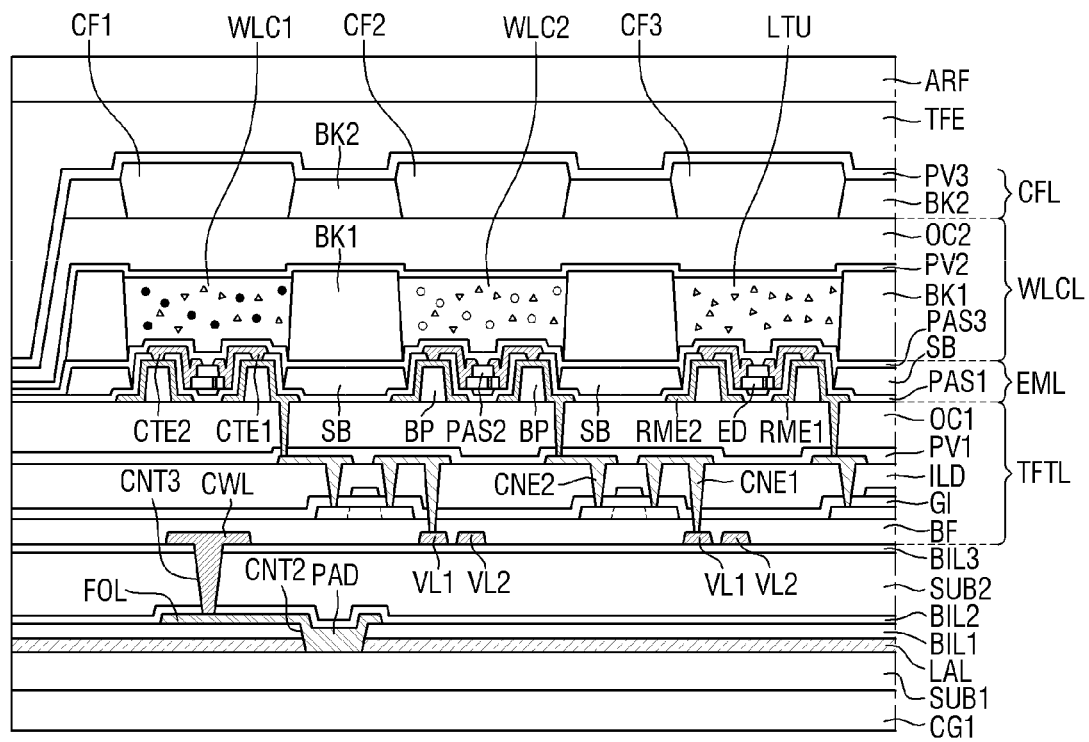
Figure 16:
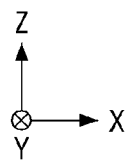

In FIG. 16, the display layer DPL may be stacked on the third barrier insulating layer BIL3. The thin film transistor layer TFTL, the light emitting element layer EML, the wavelength conversion layer WLCL, and the color filter layer CFL may be sequentially stacked on the third barrier insulating layer BIL3. The encapsulation layer TFE may cover the top and side surfaces of the display layer DPL. The anti-reflection film ARF may be formed on the encapsulation layer TFE.

Figure 17:
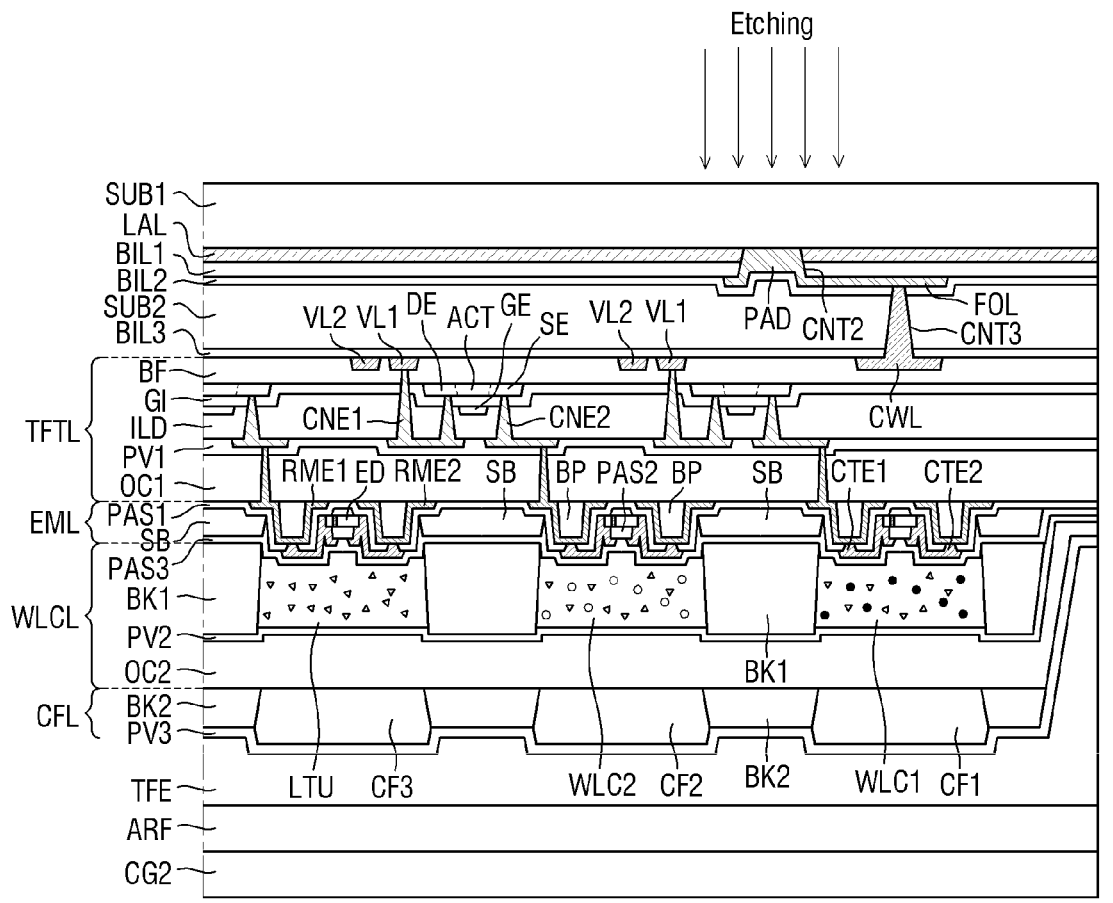
Figure 18:
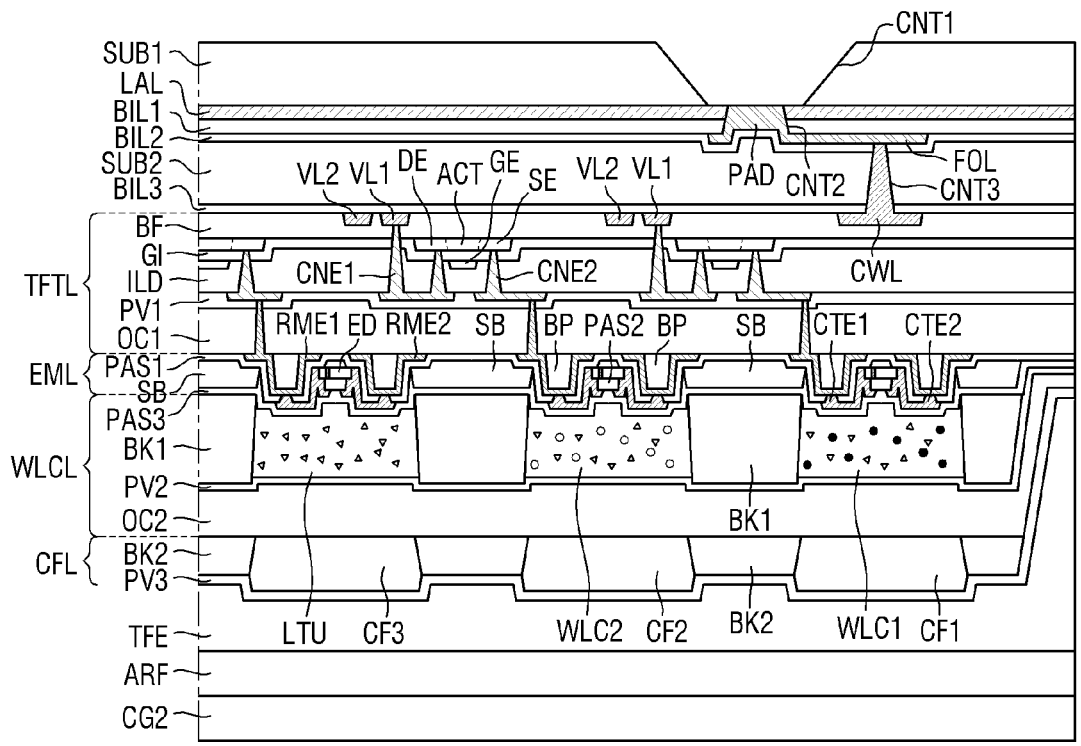
Figure 18:
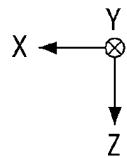

In FIGS. 17 and 18, the display device 10 being manufactured may be vertically inverted to attach the flexible film FPCB. The first carrier substrate CG1 may be removed from the first substrate SUB1. For example, the first carrier substrate CG1 may be removed from the bottom surface of the first substrate SUB1 using a sacrificial layer disposed between the first carrier substrate CG1 and the first substrate SUB1, but the present disclosure is not limited thereto.

A second carrier substrate CG2 may be disposed on one surface of the anti-reflection film ARF. The second carrier substrate CG2 may support the vertically inverted display device 10. For example, the second carrier substrate CG2 may be a carrier glass, but is not limited thereto.

One surface of the first substrate SUB1 may be subjected to a laser etching process. The first contact hole CNT1 may be provided in the first substrate SUB1 to expose the pad portion PAD and a portion of the laser absorption layer LAL. The laser absorption layer LAL may absorb an ultraviolet laser in the etching process of the first substrate SUB1 to prevent transmission of the ultraviolet laser. Here, the ultraviolet laser may have a wavelength of about 300 nm to 400 nm, preferably, a wavelength of about 340 nm to 350 nm. The laser absorption layer LAL may absorb the ultraviolet laser in the etching process of the first substrate SUB1, thereby preventing damage to the second substrate SUB2 or the display layer DPL.

The pad portion PAD may absorb the ultraviolet laser in a region where the laser absorption layer LAL is not disposed, and may prevent damage to the second substrate SUB2 or the display layer DPL in the etching process of the first substrate SUB1. Accordingly, the display device 10 may include the laser absorption layer LAL and the pad portion PAD, thereby preventing damage to the second substrate SUB2 or the display layer DPL in the etching process of the first substrate SUB1.

Figure 19:
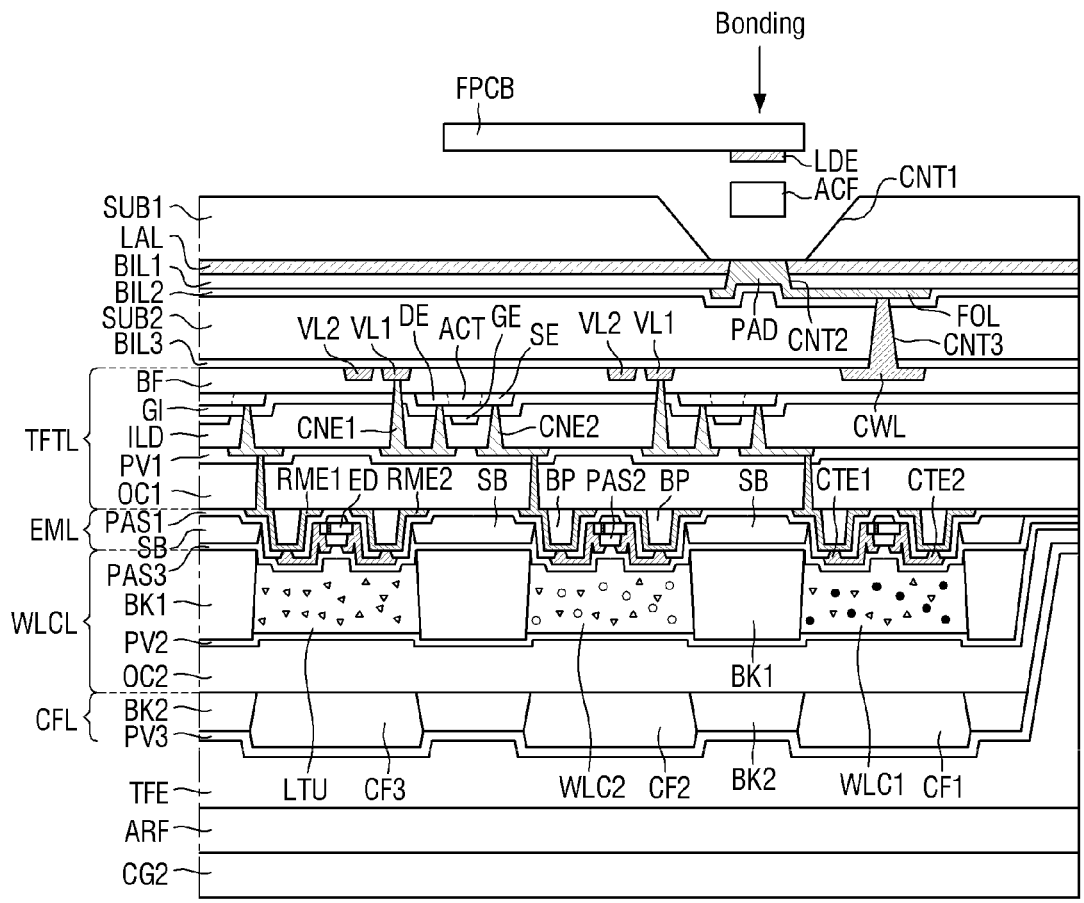
Figure 20:
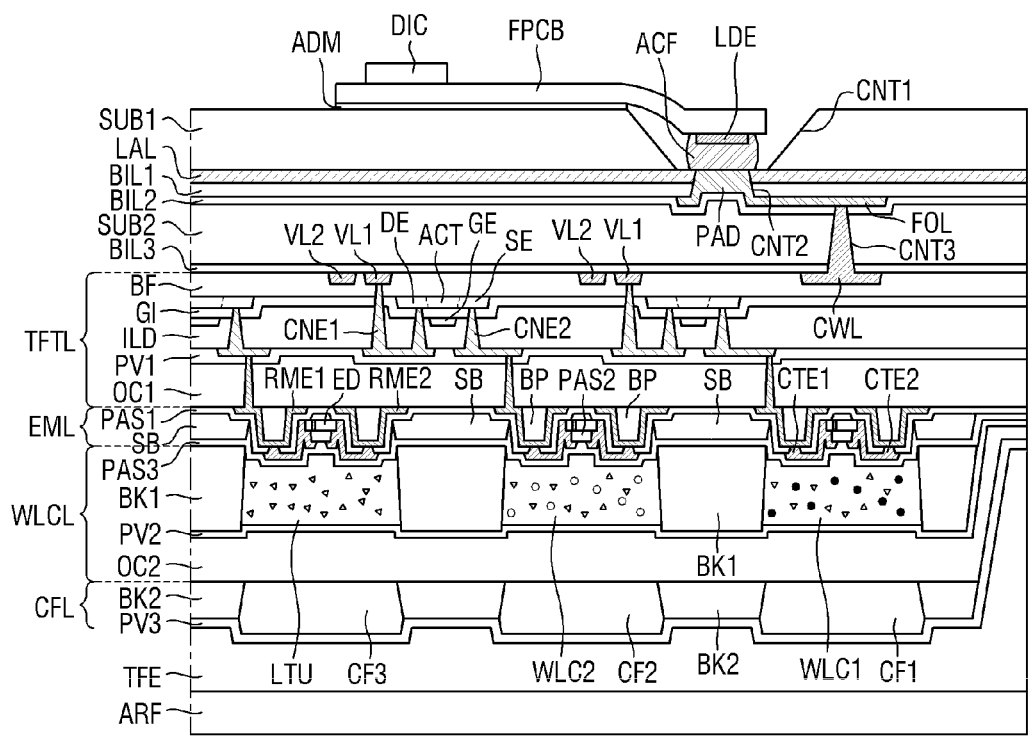
Figure 20:
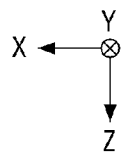

In FIGS. 19 and 20, the flexible film FPCB may be disposed on one surface of the first substrate SUB1. The flexible film FPCB and the lead electrode LDE may be aligned on the pad portion PAD through an alignment process. For example, the lead electrode LDE of the flexible film FPCB may be attached to the pad portion PAD through ultrasonic bonding or thermocompression bonding, but the bonding method is not limited thereto. The connection film ACF may have conductivity in a region where the pad portion PAD and the lead electrode LDE are in contact with each other, and may electrically connect the flexible film FPCB to the pad portion PAD.

In concluding the detailed description, those skilled in the art will appreciate that many variations and modifications can be made to the embodiments without substantially departing from the principles and scope of the present disclosure. Therefore, the embodiments of the present disclosure are used in a generic and descriptive sense only and not for purposes of limitation.

What is claimed is:

1. A display device comprising:
    a substrate including a first contact hole;
    a laser absorption layer on the substrate and comprising amorphous silicon;
    a first barrier insulating layer on the laser absorption layer;
    a fan-out line on the first barrier insulating layer as a first metal layer and comprising a pad portion in a second contact hole located in the first barrier insulating layer and the laser absorption layer;
    a display layer on the fan-out line; and
    a flexible film under the substrate and in the first contact hole and electrically connected to the pad portion.

2. The display device of claim 1, wherein the laser absorption layer has a thickness of 300 angstroms (Å) to 1000 Å.

3. The display device of claim 1, wherein the laser absorption layer has a transmittance of 10% or less for light having a wavelength of 300 nm to 400 nm.

4. The display device of claim 1, wherein a thickness of the laser absorption layer is smaller than a thickness of the first barrier insulating layer.

5. The display device of claim 1, wherein a thickness of the laser absorption layer is smaller than a thickness of the fan-out line.

6. The display device of claim 1, wherein the display layer comprises:
    a connection portion on the first metal layer as a second metal layer and connected to the fan-out line;
    a data line extending in a first direction as the second metal layer; and
    high potential lines on the second metal layer and extending in the first direction.

7. The display device of claim 6, wherein the pad portion is configured to supply a data voltage to the data line through the connection portion, and the pad portion is configured to supply a high potential voltage to the high potential lines through the connection portion.

8. The display device of claim 6, wherein the display layer comprises:
a thin film transistor comprising an active layer on the second metal layer and a third metal layer; and
a connection electrode on the third metal layer as a fourth metal layer,
wherein one end of the connection electrode is connected to the high potential line, and the other end of the connection electrode is connected to the thin film transistor.

9. The display device of claim 8, wherein the display layer further comprises a light emitting element layer on the fourth metal layer, and
wherein the light emitting element layer comprises:
a first electrode connected to the connection electrode;
a second electrode at a same layer as the first electrode; and
a light emitting element aligned between the first electrode and the second electrode and electrically connected between the first electrode and the second electrode.

10. The display device of claim 1, further comprising a display driver mounted on the flexible film to supply at least one of a data voltage, a power voltage, or a gate signal.

11. A method of manufacturing a display device, comprising:
forming a laser absorption layer comprising amorphous silicon on a first substrate;
forming a first barrier insulating layer on the laser absorption layer;
forming a first contact hole through the first barrier insulating layer and the laser absorption layer;
forming a fan-out line on the first barrier insulating layer and comprising a pad portion in the first contact hole;
forming a display layer on the fan-out line;
exposing the pad portion and a portion of the laser absorption layer by etching the first substrate to form a second contact hole; and
inserting a flexible film into the second contact hole to electrically connect the flexible film to the pad portion.

12. The method of claim 11, wherein the exposing of the pad portion and a portion of the laser absorption layer comprises irradiating a laser having a wavelength of 300 nm to 400 nm to the first substrate.

13. The method of claim 12, further comprising forming a second substrate on the fan-out line.

14. The method of claim 13, wherein in the exposing of the pad portion and a portion of the laser absorption layer, the laser absorption layer and the pad portion absorb the laser.

15. The method of claim 11, wherein the forming of the first contact hole comprises exposing a portion of the first substrate by etching the first barrier insulating layer and the laser absorption layer.

16. The method of claim 11, wherein the laser absorption layer has a thickness of 300 Å to 1000 Å.

17. The method of claim 11, wherein the laser absorption layer has a transmittance of 10% or less for light having a wavelength of 300 nm to 400 nm.

18. The method of claim 11, wherein a thickness of the laser absorption layer is smaller than a thickness of the first barrier insulating layer.

19. The method of claim 11, wherein a thickness of the laser absorption layer is smaller than a thickness of the fan-out line.

20. A tiled display device comprising:
a plurality of display devices comprising a display area comprising a plurality of pixels and a non-display area surrounding the display area; and
a bonding member configured to bond the plurality of display devices,
wherein at least one of the plurality of display devices comprises:
a substrate including a first contact hole;
a laser absorption layer on the substrate and comprising amorphous silicon;
a first barrier insulating layer on the laser absorption layer;
a fan-out line on the first barrier insulating layer as a first metal layer and comprising a pad portion in a second contact hole located in the first barrier insulating layer and the laser absorption layer;
a display layer on the fan-out line; and
a flexible film under the substrate and in the first contact hole and electrically connected to the pad portion.

* * * * *